United States Patent
Takahashi et al.

(10) Patent No.: US 6,728,158 B2
(45) Date of Patent: Apr. 27, 2004

(54) SEMICONDUCTOR MEMORY DEVICE

(75) Inventors: Hiroyuki Takahashi, Tokyo (JP); Eiji Haseo, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 161 days.

(21) Appl. No.: 10/027,461

(22) Filed: Dec. 21, 2001

(65) Prior Publication Data
US 2002/0080666 A1 Jun. 27, 2002

(30) Foreign Application Priority Data
Dec. 25, 2000 (JP) ........................................ 2000-393751

(51) Int. Cl.$^7$ ................................................ G11C 7/00
(52) U.S. Cl. ...................... 365/225.7; 365/201; 365/205; 326/10; 327/525; 327/526
(58) Field of Search ............................ 365/200, 225.7, 365/201, 205; 326/10, 12, 13; 327/525, 526

(56) References Cited

U.S. PATENT DOCUMENTS

| | | | | |
|---|---|---|---|---|
| 4,654,830 A | * | 3/1987 | Chua et al. | 365/200 |
| 5,387,823 A | * | 2/1995 | Ashizawa | 326/13 |
| 5,689,465 A | * | 11/1997 | Sukegawa et al. | 365/200 |
| 6,041,006 A | * | 3/2000 | Tsuchiya | 365/210 |
| 2002/0054518 A1 | * | 5/2002 | Ooishi et al. | 365/200 |

* cited by examiner

Primary Examiner—Richard Elms
Assistant Examiner—Nam Nguyen
(74) Attorney, Agent, or Firm—Darryl G. Walker; Bradley T. Sako

(57) ABSTRACT

A semiconductor memory device (100) including a memory cell array (MARY) and redundant memory cells (RROW) has been disclosed. A stored defect address (FA) may be programmed in a defect address storing circuit (PRG) corresponding with a defective address in the memory cell array (MARY). A controllable impedance device (TN0) may be selectively turned off to reduce a current passing through intact fuses (F01–F02 to Fn1–Fn2). The controllable impedance device (TN0) may be turned off in response to a potential applied to a pad electrode (PD), a predetermined combination of control signals (CS, OE, WE, etc.), or a reset signal (SR) generated by a power on reset circuit (PON). In this way, current may be reduced when defect address storing circuit does not have a stored defective address (FA). Also, current may be reduced during the semiconductor device characterization so that characterization results may be improved.

20 Claims, 9 Drawing Sheets

(a)

(b)

SEMICONDUCTOR MEMORY DEVICE

TECHNICAL FIELD

The present invention relates generally to a semiconductor memory device and more particularly to a semiconductor memory device having a redundant circuit for replacing defects by using programmable elements for storing a defect address value.

BACKGROUND OF THE INVENTION

As semiconductor devices are made with finer geometries, the memory capacity of a semiconductor memory device, such as a dynamic random access memory (DRAM), becomes increasingly large. As the size of device structures is decreased, such as in the memory array region, manufacturing defects are increased, thereby decreasing the product yield and increasing manufacturing costs. For this reason, it is essential to incorporate redundant circuits to replace one or more defective memory cells in a mass memory. A redundant circuit for a semiconductor memory device includes a redundant row or a redundant column, which can correspond to a normal row or normal column in the memory cell array. The redundant circuit also includes a structure for detecting an address match between the applied address and a stored defective address. When an address match is indicated the corresponding normal row or normal column is replaced with a redundant row or a redundant column. In this way, a semiconductor memory device having a defect can still be used as a good device and yield can be increased.

A description will now be given of conventional approaches for detecting whether or not the applied address, such as an external address, coincides with the stored defective address.

Referring now to FIG. 9(a), a conventional defect detecting circuit is set forth in a block schematic diagram and given the general reference character 700.

The conventional defect detecting circuit 700 detects an address match between the applied address (A0 to An) and a stored defective address and generates a coincidence detection signal RE.

Conventional defect detecting circuit 700 includes a coincidence detecting circuit 700A and an address transition detecting circuit 700B. Coincidence detecting circuit 700A detects the coincidence of an externally input address (A0 to An) with a stored defective address. Coincidence detecting circuit 700A is initialized in response to a reset signal φr every time a new externally input address is received. Address transition detecting circuit 700B detects a change in the externally input address (A0 to An) to generate the reset signal φr.

Referring now to FIG. 9(b) coincidence detecting circuit 700A is set forth in a circuit schematic diagram.

Coincidence detecting circuit 700A includes a p-type field effect transistor TP700 having a source connected to VDD, a drain connected to internal lode ND, and a gate connected to receive reset signal φr. P-type field effect transistor TP700 forms a precharge path between internal node ND and VDD. For each address received, there are two discharge paths between internal node ND and VSS. For address A0, a first discharge path is formed by n-type field effect transistor TN0T and fuse F0T and a second discharge path is formed by n-type field effect transistor TN0N and fuse F0N. N-type field effect transistor TN0T has a source connected to VSS, a drain connected to a first fuse terminal, and a gate connected to receive true address A0T. Fuse F0T has a second fuse terminal connected to internal node ND. N-type field effect transistor TN0N has a source connected to VSS, a drain connected to a first fuse terminal, and a gate connected to receive complementary address A0N. Fuse F0N has a second fuse terminal connected to internal node ND. Similarly, N-type field effect transistors (TN1T–TN1N to TNnT–TNnN) and fuses (F1T–F1N to FnT–FnN), respectively, are configured to provide two discharge paths between internal node ND and VSS for each address (A1 to An). However, only one of each of the two discharge paths is active at any time based on whether the corresponding address has a logic one or logic zero value. For example, if address A0 is high, true address A0T is high and n-type field effect transistor TN0T is turned on and the discharge path formed by n-type field effect transistor TN0T and fuse F0T is turned on. Also, complementary address A0N is low and n-type field effect transistor TN0N is turned off, and the discharge path formed by n-type field effect transistor TN0N and fuse F0T is turned off. However, if address A0 is low, complementary address A0T is high and n-type field effect transistor TN0N is turned on. Also, true address A0T is low and n-type field effect transistor TN0T is turned off and the discharge path formed by n-type field effect transistor TN0T and fuse F0T is turned off. Discharge paths that receive true and complementary address bits (A1T–A1N to AnT–AnN) are similarly configured.

Fuses that are programmed to indicate either a logic one or a logic zero for each address (A0 to An) is programmed for the stored defective address. For example, if the stored defective address has an address A0 that is a logic one, fuse F0T is blown or opened. Thus, when received address A0 is high, true address TN0T is high. However, even though n-type field effect transistor TN0T is turned on, fuse F0T prevents the discharge path formed by n-type field effect transistor TN0T and fuse F0T from being enabled. Likewise, if the stored defective address has an address A0 that is a logic zero, fuse F0N is blown or opened. Thus, when received address A0 is low, complementary address A0T is high. However, even though n-type field effect transistor A0N is turned on, fuse F0N prevents the discharge path formed by n-type field effect transistor TN0N and fuse F0N from being enabled. Other stored addresses are similarly programmed so that when there is a match between the applied address (A0 to An) and the stored address, all discharge paths are disabled and internal node ND remains high.

Buffer BF700 receives internal node ND and provides a coincidence detection signal RE.

The operation of the first conventional example illustrated in FIG. 9 will now be described.

First, a defect address is determined by a probe test. Fuses (F0T–F0N to FnT–FnN) are selectively cut or blown in accordance with the defect address to provide a stored defect address in the coincidence detecting circuit 700A. For example, when the least significant bit of the defect address is a logic one, fuse F0T, of the pair of fuses (F0T and F0N) that correspond to external address A0, is blown or cut. In this way, fuse F0T that forms the discharge path when the true address A0T is high is cut and fuse F0N that forms the discharge path when the complementary address A0T is high is left intact. Respective fuse pairs (F1T–F1N to FnT–FnN) are programmed in accordance with other logic values of the defect address.

As described above, the stored defect address is programmed in the coincidence detecting circuit 700A. During operation, the stored defect address is compared with the receive address (A0 to An) every time the received address (A0 to An) changes value. In other words, for example, if the external address A0 changes from a logic zero to a logic one, address transition detecting circuit 700B detects the change (transition) and outputs a low level pulse as the reset signal φr. Upon receiving the reset signal φr, the p-type field effect transistor TP700 in coincidence detecting circuit 700A is temporarily turned on to charge (precharge) the parasitic capacitance of the internal node ND to a high level.

When the address A0 changes to a logic one, true address A0T becomes high and n-type field effect transistor TN0T is turned on. However, because fuse F0T is in the cut state, the discharge path formed by n-type field effect transistor TN0T and fuse F0T does not conduct current. Because address A0 is low, complementary address A0T remains low and n-type field effect transistor TN0N is turned off. Because n-type field effect transistor TN0N is turned off, the discharge path formed by n-type field effect transistor TN0N and fuse F0N does not conduct current. Because both discharge paths remain turned off (and assuming other discharge paths corresponding to other addresses (A1 to An) are off due to matches with the corresponding stored defect address), internal node ND remains at the high level and the received address (A0 to An) matches with the stored defect address. In response to a high internal node ND, buffer BF700 outputs a coincidence detection signal RE having a high level.

However, when the address A0 changes from a logic one to a logic zero, complementary address signal A0T becomes high. With complementary address signal A0T high, n-type field effect transistor TN0N turns on and internal node ND is discharged through the discharge path n-type field effect transistor TN0N and fuse F0N. Similarly, other discharge paths may be turned on when the applied address (A1 to An) does not match with the corresponding stored defect address.

In this way, when an applied address (A0 to An) does not match with the stored address, internal node ND becomes low and buffer BF700 outputs a coincidence detection signal RE having a low level. However, when an applied address (A0 to An) does match with the stored address, internal node ND remains high and buffer BF700 outputs a coincidence detection signal RE having a high level.

In the first conventional example illustrated in FIG. 9, reset signal φr is a low going pulse and p-type field effect transistor TP700 is only turned on during the pulse low period. In this way, there is no static current flowing through the fuses from VDD to VSS and current consumption of the conventional defect detecting circuit 700 can be reduced.

Referring now to FIG. 10(a), a second conventional defect detecting circuit is set forth in a circuit schematic diagram and given the general reference character 800.

Conventional defect detecting circuit 800 is configured to select the true address bit or complementary address bit on the basis of the program state of a corresponding fuse for each stored defective address bit. In FIG. 10(a), only circuitry corresponding to received address A0 is illustrated to avoid unduly cluttering the figure. Conventional defect detecting circuit 800 includes a fuse circuit 800A, a signal select circuit 800B, and a logical product circuit 800C. Fuse circuit 800A stores a defect address for address A0 and provides a defect address value FA0 to signal select circuit 800B. Signal select circuit 800B receives applied address A0 and provides either a true address A0T or a complementary address A0N to logical product circuit 800C in response to the logic level of defect address value FA0. A fuse circuit 800A and a signal select circuit 800B is provided corresponding to each remaining address (A1 to An). Logical product circuit 800C receives the true or complementary address (A0T/A0N to AnT/AnN) from respective signal select circuits 800B and provides a coincidence detection signal RE in response thereto.

Signal select circuit 800B includes n-type field effect transistors (801B and 802B) and inverters (803B and 804B). N-type field effect transistor 801B has a source connected to receive applied address A0, a drain connected to logical product circuit 800C and a gate connected to receive defect address value FA0. N-type field effect transistor 802B has a source connected to receive applied address A0 through inverter 803B, a drain commonly connected to the drain of n-type field effect transistor 801B, and a gate connected to receive defect address value FA0 through inverter 804B.

Referring now to FIG. 10(b), fuse circuit 800A is set forth in a circuit schematic diagram.

Fuse circuit 800A includes a fuse 801A, resistors (802A and 803A), an inverter 804A, and a n-type field effect transistor 805A. Fuse 801A has one terminal connected to VDD and another terminal connected to a connection node. Resistor 802A has one terminal connected to VSS and another terminal connected to a connection node. Inverter 804A has an input connected to connection node and an output connected to provide defect address value FA0. N-type field effect transistor 805A has a source connected to VSS, a drain connected to the connection node and a gate connected to receive defect address value FA0. Resistor 803A has one terminal connected to VDD and another terminal connected to defect address value FA0.

When fuse 801A is not cut (intact), the input of inverter 804A is forced high through fuse 801A. With a high input, inverter 804A provides a defect address value FA0 having a low level. In this case, stored address bit in fuse circuit 800A corresponding to address A0 has a logic zero.

When fuse 801A is cut or blown, the input of inverter 804A is forced low through resistor 802A. With a low input, inverter 804A provides a defect address value FA0 having a high level. At the same time, the defect address value FA0 is pulled up by resistor 803A. When defect address value FA0 rises a threshold voltage of n-type field effect transistor 805A above VSS, n-type field effect transistor 805A is turned on to latch a logic low at the input of inverter 804A. In this case, stored address bit in fuse circuit 800A corresponding to address A0 has a logic one and defect address value FA0 has a high level.

In this way, fuse circuit 800A is configured to store and output defect address value FA0 having a logical value (one or zero) in accordance with the state of fuse 801A (intact or cut).

The operation of conventional defect detecting circuit 800 illustrated in FIG. 10 will now be described.

Defect address detecting circuit 800 provides a coincidence detection signal RE having a high level only when all of the input signals to the logical product circuit 800C are at a high level and thereby detects that the defect address and the applied address (A0 to An) coincide or match with each other. Therefore, when the applied address (A0 to An) has the same logical values as the stored defect address, the defect address values (FA0 to FAn) from respective fuse circuits 800A are provided in combination with applied address (A0 to An) to respective signal select circuits 800B so that input signals of the logical product circuit 800C become high. Thus, the select state is determined in accordance with the stored defect address programmed in the fuse circuit 800A matching the applied address (A0 to An).

When a logic zero is programmed in the fuse circuit 800A (fuse 801A intact), defect address value FA0 is low. With defect address value FA0 is low, n-type field effect transistor 801B is turned off. Inverter 804B provides a logic one (high value) to the gate of n-type field effect transistor 802B. Thus, n-type field effect transistor 802B is turned on. With n-type field effect transistor 801B turned off and n-type field effect transistor 802B turned on, signal select circuit 800B provides the complementary address A0T from the output of inverter 803B to the input of logical product circuit 800C. In this way, when a logic zero is programmed in the fuse circuit 800A, the signal select circuit 800B outputs a high level to the logical product circuit 800C only the applied address A0 is a logic zero.

When a logic one is programmed in the fuse circuit 800A (fuse 801A blown or cut), defect address value FA0 is high. With defect address value FA0 is high, n-type field effect transistor 801B is turned on. Inverter 804B provides a logic zero (low value) to the gate of n-type field effect transistor 802B. Thus, n-type field effect transistor 802B is turned off. With n-type field effect transistor 801B turned on and n-type field effect transistor 802B turned off, signal select circuit 800B provides the true address A0T to the input of logical product circuit 800C. In this way, when a logic one is programmed in the fuse circuit 800A, the signal select circuit 800B outputs a high level to the logical product circuit 800C only the applied address A0 is a logic one.

Other applied addresses (A1 to An) include a fuse circuit 800A and signal select circuit 800B that operate in the same manner as described above.

Accordingly, only when the combination of logic values of the applied address (A0 to An) coincides or matches with the combination of logic values of the stored defect address, all the inputs to logical product circuit 800C become high and coincidence detection signal RE having a logic high is output. In this way, it is possible to detect an address location that has been replaced with redundant circuits on the basis of the coincidence detection signal RE.

In the second conventional example as illustrated in FIG. 10, an operation for charging the internal node in accordance with the reset signal φr is not needed. Thus, the operating speed of the second conventional example as illustrated in FIG. 10 may be improved over the first conventional example as illustrated in FIG. 9.

Referring now to FIG. 11, a third conventional example is set forth illustrating a fuse circuit for indicating whether or not a redundant circuit is being used. The fuse circuit is given the general reference character 1100. Fuse circuit 1100 is disclosed in Japanese Patent Application Laid-open No. Hei 5-89696.

Fuse circuit 1100 includes fuses (FA and FB) connected in series between a power supply and ground. Either fuse FA or fuse FB is cut or blown in accordance with whether or not a particular redundant circuit is being used. In this way, the potential V1 at a connection node between fuse FA and fuse FB indicates the use of a redundant circuit.

In this way, potential V1 is determined by providing a power supply potential to the connection node through the intact fuse (FA or FB). Thus, the use of redundancy can be determined immediately after the power supply turns on without the risk of malfunction by providing power-up setting circuitry.

Referring now to FIG. 12, a fourth conventional example is set forth illustrating an address program circuit designated by the general reference character 900.

Address program circuit 900 is used to program a defect address and includes pairs of fuses (901 and 902) corresponding to the number of address bits used to identify redundant circuit replacement. Fuses (901 and 902) operate as a unit pair and one of the unit pair of fuses (901 or 902) is cut corresponding to the value of the address bit corresponding to the defective circuit that is being replaced with a redundant circuit.

When stored defect address AX0S is programmed to have a logic zero, fuse 901, of the pair of fuses (901 and 902), is cut. As a result, the potential of the connection node between fuses (901 and 902) is fixed to the ground potential to provide a stored defect address AX0S having a logic zero.

Alternatively, when stored defect address AX0S is programmed to have a logic one, fuse 902, of the pair of fuses (901 and 902), is cut. As a result, the potential of the connection node between fuses (901 and 902) is fixed to the power supply potential (through p-type field effect transistor 903) to provide a stored defect address AX0S having a logic one.

The operation of the address program circuit 900 will now be briefly described. P-type field effect transistor 903 is turned off during the reset operation. During this time, current consumption may be eliminated by preventing current from flowing through fuses (901 and 902). However, in normal operation, p-type field effect transistor 903 is turned on. As a result, the programmed logic values (zero or one) is output as stored defect addresses (AX0S to AX7S) in accordance with the states of fuses (901 and 902).

According to the fourth conventional example illustrated in FIG. 12, the logic values of stored defect addresses (AX0S to AX7S) are simultaneously set by turning p-type field effect transistor 903 on to provide power. In this way, there may be no dependence in access time based on a difference in the stored defect address.

Note that, according to the first conventional example illustrated in FIG. 9, it is necessary that a change in the applied addresses (A0 to An) is detected by the address transition detecting circuit 700B to generate the reset signal φr in order to charge the internal node ND of the coincidence detecting circuit 700A before comparing the applied addresses (A0 to An) with the stored defect address. Thus, a time delay may be required until a valid coincidence detection signal RE is generated. This can adversely affect the operating speed of the redundant circuit.

According to the second conventional example illustrated in FIG. 10, when fuse 801A of fuse circuit 800 is not cut, a current continuously flows between the power supply and ground through fuse 801A and resistor 802A. Also, because in this state inverter 804A outputs a low level, current continuously flows between the power supply and ground through resistor 803A and inverter 804A. For this reason, current consumption in the redundant circuit increases which may have adverse affects on standby and operating currents.

Additionally, according to the third conventional example illustrated in FIG. 11, when circuitry is tested to determine the necessity of using the redundant circuitry, both fuses (FA and FB) are in the intact state. During this time, the power supply and ground may be short-circuited through the fuses (FA and FB) thereby producing excessive current. This may cause fluctuations in the power supply level during the test period and can adversely affect the integrity of the test for defects. Japanese Patent Application Laid-open No. Hei 5-89696 also discloses an example in which a pad electrode for supplying a power supply to the fuses is disposed so that the power supply connection (pad electrode) may be made floating during the defect test. However, according to this example, the pad electrode needs to be bonded to an external terminal after the defect test has been performed. Thus, it is necessary to provide a pad electrode that satisfies the same design standard as that of a normal pad electrode. This can adversely affect the chip layout.

According to the fourth conventional example illustrated in FIG. 12, when circuitry is tested to determine the necessity of using the redundant circuitry, both fuses (901 and 902) are also in the intact state. Thus, when p-type field effect transistor 903 is turned on, an excessive current may flow through the fuses. This may cause fluctuations in the power supply level during the test period and can adversely affect the integrity of the test for defects.

In view of the above discussion, it would be desirable to provide a semiconductor memory device that may be capable of replacing defective circuitry with redundant circuits having low current consumption and high speeds. It would also be desirable to provide a semiconductor memory device that may have a defect test without allowing excessive current to occur which may adversely affect the integrity of the defect test.

SUMMARY OF THE INVENTION

According to the present embodiments, a semiconductor memory device includes a memory cell array and redundant memory cells. A stored defect address may be programmed in a defect address storing circuit corresponding with a defective address in the memory cell array. A controllable impedance device may be selectively turned off to reduce a current passing through intact fuses. The controllable impedance device may be turned off in response to a potential applied to a pad electrode, a predetermined combination of control signals, or a reset signal generated by a power on reset circuit. In this way, current may be reduced when the defect address storing circuit does not have a stored defective address. Also, current may be reduced during the semiconductor device characterization so that characterization results may be improved.

According to one aspect of the embodiments, a semiconductor memory device may include a defect address memory circuit that may be programmable to store a defect address corresponding to an address location of at least one normal memory cell in a memory cell array that is replaced with at least one redundant memory cell when a received address matches the defective address. The defect memory circuit may include first and second fuses electrically connected in series and coupled between a first supply potential and a second supply potential. One of the first and second fuses may be cut in accordance with a logical value of a bit of the defect address when the at least one normal memory cell is replaced with at least one redundant memory cell. A current cut off circuit may essentially cut off a current that passes through the first and second fuses during a characterization of the semiconductor memory device.

According to another aspect of the embodiments, the current cut off circuit may essentially cut off the current that passes through the first and second fuses when the defect memory circuit does not store the defect address.

According to another aspect of the embodiments, the current cut off circuit may include first and second field effect transistors having current paths coupled in series with the first and second fuses. A pad electrode may be coupled to a control gate of the first field effect transistor. A load device may be coupled between the first supply potential and the pad electrode. A fuse circuit may be coupled to a control gate of the second field effect transistor to determine a conductive state of the second field effect transistor in accordance with whether the defect memory circuit stores the defect address.

According to another aspect of the embodiments, the current cut off circuit may include a field effect transistor having a current path coupled in series with the first and second fuses. A flip-flop circuit may be coupled to a control gate of the field effect transistor.

According to another aspect of the embodiments, the current cut off circuit further includes a mode entry circuit that may detect a current cutoff mode to set the flip-flop in a state where the field effect transistor is turned off.

According to another aspect of the embodiments, the current cutoff circuit may include a programmable device to prevent the test mode entry circuit from setting the state of the flip-flop.

According to another aspect of the embodiments, upon power-up, the flip-flop may be set in a state where the field effect transistor is turned on.

According to another aspect of the embodiments, the current cut off circuit may include a reset circuit that detects a power up operation and may provide a reset signal to set the state of the flip-flop.

According to another aspect of the embodiments, a semiconductor memory device may include a defect address storing circuit programmable to store a defect address corresponding to an address location of at least one normal memory cell in a memory cell array that is replaced with at least one redundant memory cell. The defect address storing circuit may include a plurality of programmable element pairs. Each programmable element pair may include first and second programmable elements electrically connected in series and coupled between a first supply potential and an internal supply potential node. One of the first and second programmable elements may be programmed to be in a non-conductive state in accordance with a logical value of a corresponding bit of the defect address when the at least one normal memory cell is replaced with at least one redundant memory cell. A current cut off circuit may be coupled to the internal supply potential node and may essentially cut off a current that passes through the plurality of programmable element pairs during a characterization of the semiconductor memory device.

According to another aspect of the embodiments, the current cut off circuit may include a first field effect transistor coupled between the internal supply potential node and a second supply potential.

According to another aspect of the embodiments, the current cut off circuit may include a probe pad coupled to a control gate of the first field effect transistor.

According to another aspect of the embodiments, the current cut off circuit may include a mode circuit for detecting a characterization entry mode and coupled to provide a control signal to a control gate of the first field effect transistor.

According to another aspect of the embodiments, the characterization of the semiconductor memory device may be performed before the defect address is stored.

According to another aspect of the embodiments, a plurality of defect address storing circuit may be coupled to the current cut off circuit.

According to another aspect of the embodiments, in a normal mode of operation, the current cut off circuit may cut off the current that passes through the plurality of programmable element pairs for each of the plurality of defect address storing circuits that do not store a corresponding defect address. In the normal mode of operation, the current cut off circuit does not cut off the current that passes through the plurality of programmable element pairs for each of the plurality of defect address storing circuits that do store a corresponding defect address.

According to another aspect of the embodiments, a semiconductor memory device may include a defect address storing circuit may be programmable to store a defect address corresponding to an address location of at least one normal memory cell in a memory cell array that is replaced with at least one redundant memory cell. The defect address storing circuit may include a plurality of programmable element pairs. Each programmable element pair may include first and second programmable elements electrically connected in series and coupled between a first supply potential and an internal supply potential node. One of the first and second programmable elements may be programmed to be in a non-conductive state in accordance with a logical value of a corresponding bit of the defect address when the at least one normal memory cell is replaced with at least one redundant memory cell. A current cut off circuit may include a cut off circuit current path coupled between the internal supply potential node and a second supply potential and may essentially cut off the cut off circuit current path during a characterization of the semiconductor memory device.

According to another aspect of the embodiments, the cutoff circuit may include a third programmable element that is programmed according to whether the at least one normal memory cell is replaced with at least one redundant memory cell. The cut off circuit current path may be cut off when the third programmable element indicates that the at least one normal memory cell is not replaced with at least one redundant memory cell.

According to another aspect of the embodiments, the third programmable element may form a third programmable current path coupled between the first supply potential and the second supply potential. The cut off circuit may essentially cut off the third programmable current path during the characterization of the semiconductor memory device.

According to another aspect of the embodiments, the cut off circuit may include a probe pad that receives an externally applied potential during the characterization of the semiconductor memory device.

According to another aspect of the embodiments, the characterization of the semiconductor memory device may occur before a packaging step and before the programmable elements are selectively programmed.

DETAILED DESCRIPTION OF THE EMBODIMENTS

Various embodiments of the present invention will now be described in detail with reference to a number of drawings.

Figure 1:
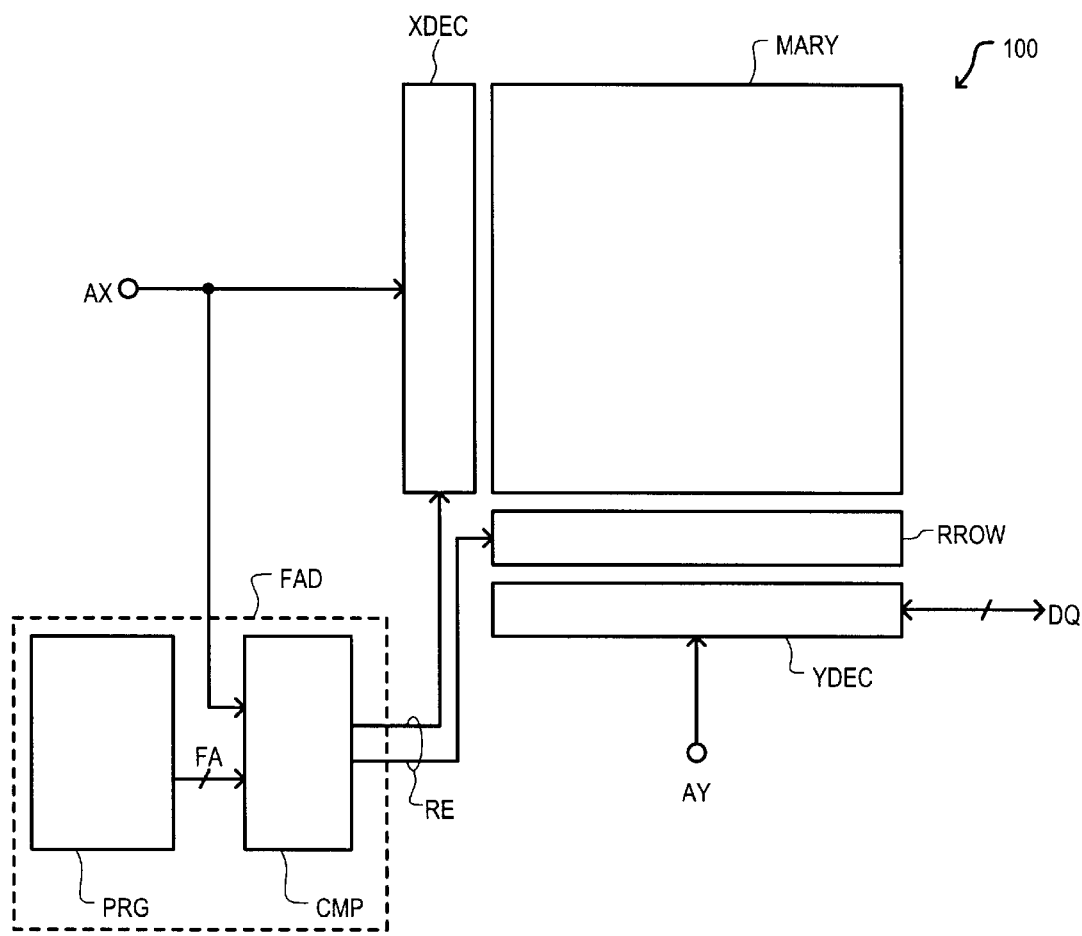
FIG. 1 is a block schematic diagram of a semiconductor memory device in accordance with an embodiment.

Referring now to FIG. 1, a semiconductor memory device in accordance with a first embodiment is set forth in a block schematic diagram and given the general reference character 100.

Semiconductor memory device 100 may include a memory cell array MARY, a row decoder XDEC, a column decoder YDEC, a redundant row RROW, a defect address detecting circuit FAD, a defect address storing circuit PRG, and an address comparing circuit CMP.

Row decoder XDEC may receive a row address AX and may activate a row (not shown) of memory cells in memory cell array MARY. Defect address detecting circuit FAD may receive row address AX and may generate coincidence detection signal RE. Coincidence detection signal RE may include a signal for activating redundant row RROW and a signal for deactivating row decoder XDEC. Column decoder YDEC may receive a column address AY and may provide a data path between selected columns (not shown) in memory cell array MARY and output pins DQ.

In this example, the memory cell array MARY may include memory cells arranged in a matrix consisting of rows and columns. Each memory cell may store one-bit of data. Word lines may be disposed and coupled to memory cells in the row direction. Bit lines may be disposed and coupled to memory cells in the column direction.

Row decoder XDEC may select (on the basis of a row address AX) a row of memory cells and may drive a predetermined word line in which a memory cell to be accessed may be included. Column decoder YDEC may select (on the basis of column address AY) a column of memory cells and may provide an access path from output pins to a bit line in which a memory cell to be accessed may be included.

Redundant row RROW may include a group of redundant memory cells arranged to correspond with at least one row of normal memory cells in memory cell array MARY. Redundant row RROW may be electrically connected to bit lines in common with the rows of normal memory cells within memory cell array MARY.

Defect address detecting circuit FAD may include a defect address storing circuit PRG and an address comparing circuit CMP. Defect address detecting circuit FAD may detect the coincidence or match of the row address AX with a stored defect address FA and may output a coincidence detection signal RE. Defect address storing circuit PRG may be provided with programmable elements, such as fuses, in which the defect address may be stored to provide the stored defect address FA. Stored defect address FA may be programmed by, for example, the state of programmable fuses. A fuse may be in a cut (blown) state or may be in an intact state. Address comparing circuit CMP may compare the row address AX with the defect address FA and may provide the coincidence detection signal RE having a high level if the aforementioned addresses (AX and FA) match with each other (have the same value).

In this example, only one redundant row RROW is shown. However, there may be a plurality of redundant rows. Likewise, there may be a plurality of redundant columns, which may be used to replace column-wise defects and/or single bit defects, as just two examples. In such a case, a circuit corresponding to defect address detecting circuit FAD may be included for each of the redundant rows and redundant columns.

Figure 2:
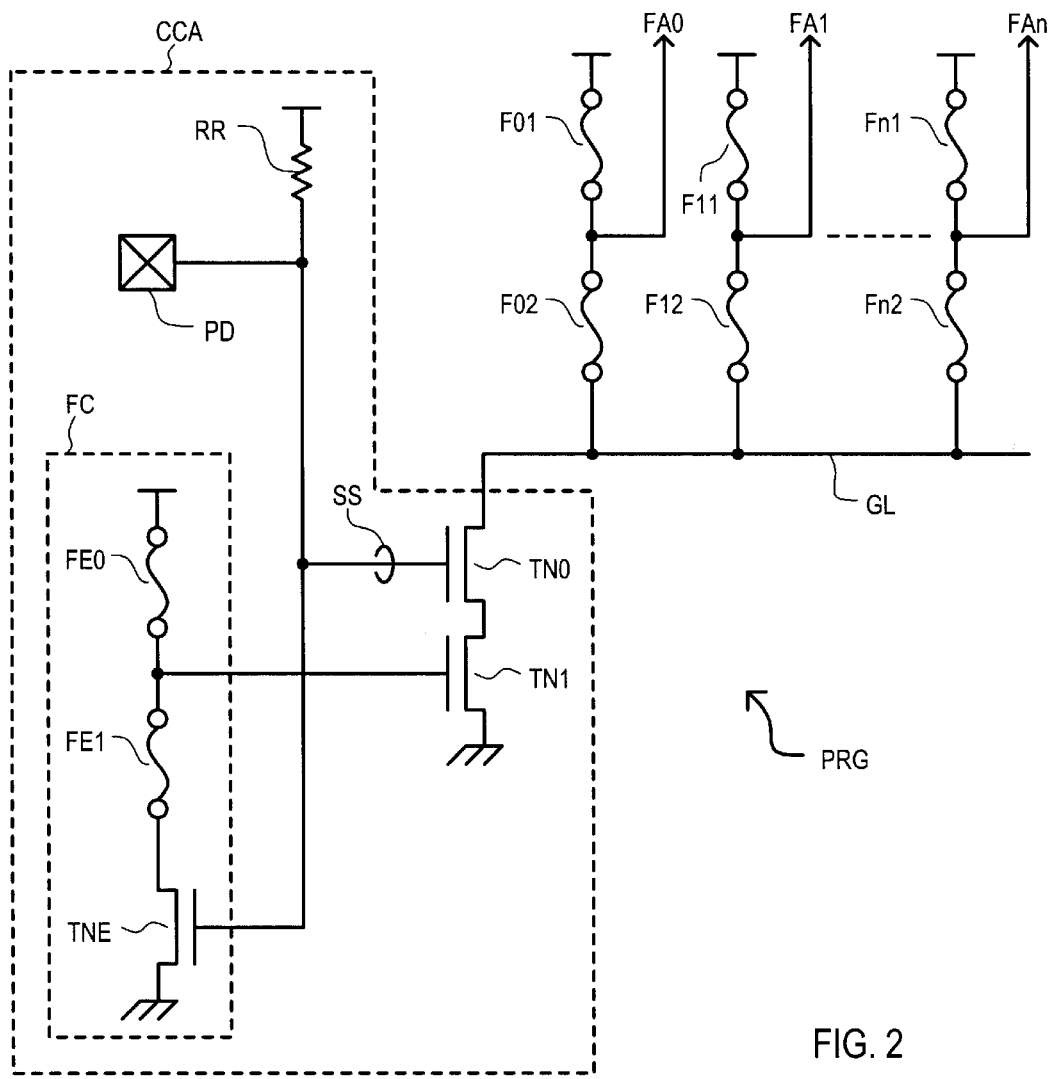
FIG. 2 is a circuit schematic diagram of a defect address storing circuit in accordance with a first embodiment.

Referring now to FIG. 2, defect address storing circuit PRG according to one embodiment is set forth in a circuit schematic diagram.

Defect address storing circuit PRG may include fuses (F01–F02 to Fn1–Fn2) and current cutoff circuit CCA. A pair of fuses (F01 and F02) may be connected in series between a power supply and an internal ground wiring GL. Fuse F01 may have one terminal connected to the power supply and another terminal connected to a connection node forming stored defect address FA0. Fuse F02 may have one terminal connected to internal ground wiring GL and another terminal connected to the connection node forming stored defect address FA0. In this way, fuses (F01 and F02) may form a pair of fuses that provide a connection node forming stored defect address FA0. In the same manner, fuses (F11 and F12) to fuses (Fn1 to Fn2) may form pairs of fuses that provide connection nodes forming stored defect addresses (FA1 to FAn), respectively. Each stored defect address may have a pair of fuses connected in series between the power supply and the internal grounding wiring GL.

Current cutoff circuit CCA may include a resistor RR, a pad electrode PD, n-type field effect transistors (TN0 and TN1), and a fuse circuit FC. Fuse circuit FC may include fuses (FE0 and FE1) and an n-type field effect transistor TNE. Resistor RR may have one terminal connected to the power supply and another terminal connected to the pad electrode PD and the gates of n-type field effect transistors (TN0 and TNE). Fuse FE0 may have one terminal connected to the power supply and another terminal connected to the gate of n-type field effect transistor TN1. Fuse FE1 may have one terminal connected to the gate of n-type field effect transistor TN1 and another terminal connected to a drain of n-type field effect transistor TNE. N-type field effect transistor TNE may have a source connected to ground. N-type field effect transistor TN1 may have a source connected to ground and a drain connected to a source of n-type field effect transistor TN0. N-type field effect transistor TN0 may have a drain connected to internal ground wiring GL.

When a defect test is executed, n-type field effect transistor TN0 may be turned off on the basis of signal SS formed at the common connection node between pad electrode PD and resistor RR. The signal level of the signal SS may be settable through the pad electrode PD or the load resistor RR. In this way, current consumption may be greatly reduced when desired. N-type field effect transistor TN1 may be turned on or off in accordance with the use or non-use of the redundancy circuit to replace defective circuitry. The state (on or off) of n-type field effect transistor TN1 may be determined by fuse circuit FC.

Pad electrode PD may be used when a test is executed to determine the necessity of using the redundant circuitry. This may be executed as a probe test on the semiconductor memory device 100 when it is still on a wafer with a plurality of like devices. The pad electrode PD may not be subjected to wire bonding when the semiconductor memory device 100 is packaged. Thus, pad electrode PD may be sufficiently smaller in size than a normal pad electrode that is to be wire bonded. Thus, chip size may be improved.

In the current cut off circuit CCA, n-type field effect transistor TN0, pad electrode PD and load resistor RR may operate to cut off a current that passes through fuses (F01–F11 to Fn1–Fn2) when a test is executed to determine if there is defective circuitry. Fuse circuit FC may operate to cut off the above mentioned through current in accordance with the necessity or non-necessity of use of the redundant circuitry.

A manner of programming the stored defect address will now be described.

One of each pair of fuses (F01–F02 to Fn1–Fn2) may be cut (blown) in accordance with the respective defect address to program a stored defect address in the defect address storing circuit PRG. The defect address may be obtained by performing a probe test. For example, if the logic value of the stored defect address FA0 is to be a logic one, fuse F02 may be cut (blown). With fuse F02 blown, the power potential (logic high level) may be driven onto the connection node of the pair of fuses (F01 and F02) via intact fuse F01. in this way, a logic one may be programmed as the stored defect address FA0.

Alternatively, if the logic value of the stored defect address FA0 is to be a logic zero, fuse F01 may be cut (blown). With fuse F01 blown, the ground potential (logic low level) may be driven onto the connection node of the pair of fuses (F01 and F02) via intact fuse F02 and n-type field effect transistors (TN0 and TN1). In this way, a logic zero may be programmed as the stored defect address FA0.

Similarly, the remaining stored defect addresses (FA1 to FAn) may be programmed to respectively, store either a logic zero or logic one in accordance with the defective address value.

Fuse circuit FC may indicate whether or not the defect address storing circuit PRG is being used to identify a particular defective address and thus, the redundant circuit is used. This may be accomplished by cutting one of the fuses (FE0 and FE1). In the case, where the fuse circuit FC includes a stored defect address, fuse FE1 may be cut. When fuse FE1 is cut, the power supply potential (high level) may be applied to the gate of n-type field effect transistor TN1 through intact fuse FE0. With a high level applied to its gate, n-type field effect transistor TN1 may be turned on. Alternatively, when the defect address storing circuit PRG is not being used to identify a particular defect address and the redundant circuit is not used, fuse FE0 may be cut. In this case, a high potential (power supply potential) may be applied to the gate of n-type field effect transistor TNE by way of resistor RR. With its gate at a high potential, n-type field effect transistor TNE may be turned on and the ground potential (low level) may be applied to the gate of n-type field effect transistor TN1 through the intact fuse FE1 and n-type field effect transistor TNE. In this way, n-type field effect transistor TN1 may be turned off. This may essentially eliminate current flowing from the power supply potential to the ground potential through intact fuses (F01–F02 to Fn1–Fn2).

N-type field effect transistors (TN0 and TNE) may be selectively turned off by applying a low potential to pad electrode PD. When a low potential is applied to pad electrode PD, the gates of n-type field effect transistors (TN0 and TNE) may be low. With low gate potentials, n-type field effect transistors (TN0 and TNE) may be turned off. This can eliminate current flowing from the power supply potential to the ground potential through intact fuses (FE0–FE1 and F01–F02 to Fn1–Fn2) during device characterization tests before any fuses (FE0–FE1 and F01–F02 to Fn1–Fn2) are blown.

However, when pad electrode PD is floating, node SS may be pulled high through resistor RR. Thus, gates of n-type field effect transistors (TN0 and TNE) may be high. With high gate potentials, n-type field effect transistors (TN0 and TNE) may be turned on. In this way, the state (on or off) of n-type field effect transistor TN1 may be determined by the state of fuses (FE0 and FE1) as previously described.

The operation of the embodiment illustrated in FIG. 2 will now be described.

First, the operation in the case where the semiconductor memory device 100 is being characterized to determine if defect address storing circuit PRG should include a stored defect address that may be used to identify a defective address will be described.

When a test, such as a probe test, is being executed to characterize the semiconductor memory device 100 to determine if there are bad bits that need replaced with redundancy, a probe from the tester may be brought into electrical contact with pad electrode PD. In this way, the tester may apply a low level to the pad electrode PD. As a result, a low level is applied to signal SS and the n-type field effect transistors (TN0 and TNE) may have gates at the low potential. Thus, n-type field effect transistors (TN0 and TNE) may be turned off. With n-type field effect transistor TNE turned off, a high level may be applied to the gate of n-type field effect transistor TN1 through intact fuse FE0. However, because n-type field effect transistor TN0 is connected in series with n-type field effect transistor TN1, internal ground wiring GL may be cut off from the ground. Thus, when a test is being executed to characterize the semiconductor memory device 100 to determine if there are bad bits that need replaced with redundancy, defect address storing circuit PRG may not include current paths from the power supply to ground through intact fuses (FE0–FE1 and F01–F02 to Fn1–Fn2). These current paths may be eliminated by turning off n-type field effect transistors (TNE and TN0).

Because the low level may be externally applied to pad electrode PD, a potential difference may occur across resistor RR and a current may flow through the resistor RR from the power supply to the pad electrode PD. However, because the current flows to an external device, such as a tester, it may be isolated from current that may flow to the internal ground bus on the semiconductor memory device 100. In this way, noise affects from this current may be eliminated. Also, the current may be subtracted from characterization current to provide more accurate current data. If the resistance value of load resistor RR is set to be sufficiently large, influences on the power supply potential may be eliminated. In this way, even if a low level is applied to the pad electrode PD, the test results during characterization of the semiconductor memory device 100 may not be adversely affected.

Semiconductor memory devices that have been determined to be good products and semiconductor memory devices that been determined to have defects that may be fixed with redundant circuits may be packaged and then subjected a selection test. Semiconductor memory devices that have been determined to be good products with no defect may leave fuses (F01–F02 to Fn1–Fn2) intact and fuse FE0 may be cut to disable defect address storing circuit PRG. However, prior to packaging, the semiconductor memory devices that have been determined to have fixable defects may have fuses (F01–F02 to Fn1–Fn2) selectively cut to correspond with a defective address to provide a stored defective address. At the same time, fuse FE1 may be cut to enable defect address storing circuit PRG. Fuses may be cut using a laser trimming device, as just one example.

The operation of defect address storing circuit PRG when programmed with a stored defect address will now be described.

The defect address may be obtained through the probe test as described above. The defect address may be programmed in the defect address storing circuit PRG to form a stored defect address. A description will now be given assuming that the defect address obtained during the probing test has already been programmed in the defect address storing circuit PRG.

For the simplification of the description, it is assumed that the defect addresses (FA0, FA1, . . . , FAn) are (1, 0, . . . , 0). In this case, only fuse F01 among fuses (F01 to Fn1) connected to the power supply may be intact and fuses (F12 to Fn2) among fuses (F02 to Fn2) connected to internal ground wiring GL may be intact. Fuse F02 connected to internal ground wiring GL and fuses (F11 to Fn1) connected to the power supply may be cut. Also, fuse FE1 out of fuses (FE0 and FE1) within fuse circuit FC may be cut.

In FIG. 2, because pad electrode PD may be floating, the power supply potential (high level) may be applied to the gate of n-type field effect transistor TN0 through load resistor RR. Thus, n-type field effect transistor TN0 may be turned on. Because fuse FE1 is cut, the power supply potential may be applied to the gate of n-type field effect transistor TN1. Thus, n-type field effect transistor TN1 may be turned on. In this way, internal ground wiring GL may be grounded through n-typed field effect transistors (TN0 and TN1).

As noted earlier, fuse F02 may be blown, and intact fuse F01 may provide a connection between the power supply and stored address FA0. In this way, a logic one may be provided on stored address FA0. Among the pair of fuses (F11–F12 to Fn1–Fn2), fuses (F11 to Fn1) connected to the power supply may be cut. And fuses (F12 to Fn2) that are connected to internal ground wiring GL may be intact. Intact fuses (F12 to Fn2) that are connected to internal ground wiring GL may, respectively, provide a low level to stored addresses (FA1 to FAn). In this way, stored defect addresses (FA0 to FAn) may be output from defect address storing circuit PRG.

Subsequently during the operation of semiconductor memory device 100 as illustrated in FIG. 1, address comparing circuit CMP in defect address detecting circuit FAD may receive the stored addresses (FA0 to FAn) and applied address (row address AX) and may provide a coincidence detection signal RE if the received addresses coincide or match with each other. In this way, defect address detecting circuit FAD may output the coincidence detection signal RE if the applied address corresponds to a row in memory cell array MARY in which a defect exists and has been replaced with a redundant row RROW.

Row decoder XDEC may become disabled on the basis of the coincidence detection signal RE. This may inhibit the selection of the defective normal row within the memory cell array MARY. At essentially the same time, the redundant row RRO may be selected on the basis of the coincidence detection signal RE. As a result, the normal row having a defect may be replaced with a redundant row RROW. When the replacement of the defective normal row had been thus conducted, the redundant row RROW may be selected instead of the defective normal row. In this way, data DQ may be written into or read from a redundant memory cell selected by the redundant row RROW. Thus, even if the defect exists within the memory cell array MARY data can be alternatively stored in a redundant memory cell selected in accordance with the stored defect address FA to thereby provide defect relief.

When the applied address (row address AX) does not coincide or match with the stored defect address FA, the coincidence detection signal RE outputted by address comparing circuit CMP may be low. Thus, row decoder XDEC selects the normal row within memory cell array MARY on the basis of the value of the row address AX and the redundant row RROW is not selected. In this way, a normal row access is conducted and a redundant row access is not conducted.

The operation when redundant row RROW is not used to replace a normal row will now be described.

The operation when no defect exists within memory cell array MARY will now be described with reference to FIG. 2. In this case, fuse FE0 out of fuses (FE0 and FE1) within fuse circuit FC may be cut. Pad electrode PD may not have an external potential applied and the gate of n-type field effect transistor TNE may be pulled high by resistor RR. Thus, n-type field effect transistor TNE may be turned on and the ground potential may be applied to the gate of n-type transistor TN1 through intact fuse FE1 and n-type field effect transistor TNE. Thus, n-type field effect transistor TN1 may be turned off. In this way, internal ground wire GL may be cut off from ground.

All of the fuses (F01–F02 to Fn1–Fn2) may be left intact. In this case, a logic one may be output from each of the stored defect addresses (FA0 to FAn). This stored defect address may be applied to the address comparing circuit CMP as illustrated in FIG. 1. However, the defect address comparing circuit CMP may be disabled and this stored defect address may be ignored, so that the coincidence detection signal RE may be fixed to the low level regardless of the value of the row address AX and stored defect addresses (FA0 to FAn). The defect address comparing circuit CMP may be disabled, as just one example, with the signal output from fuse circuit FC to the gate of n-type field effect transistor TN1. With the coincidence detection signal RE at the low level, row decoder XDEC may be enabled to select a normal row within the memory cell array MARY in accordance with the value of the row address AX and the redundant row RROW may remain in the non-selected state. In this way, redundant row RROW may be permanently disabled in the semiconductor memory device 100.

According to the above-mentioned embodiment illustrated in FIG. 2, the stored defect address (FA0 to FAn) may be supplied directly from either the power supply or ground through the predetermined intact fuses (F01–F02 to Fn1–Fn2). In this way, defect replacement may be conducted with a low current consumption and at a high speed.

Also, according to the embodiment illustrated in FIG. 2, when a test is performed to determine if there are defects in the semiconductor memory device 100, a low potential may be supplied to the pad electrode PD to electrically disconnect the internal ground wiring GL and ground. This may disable current paths to ground through intact fuses (F01–F02 to Fn1–Fn2) to ground so that affects on characterization may be eliminated. Also, by applying a low potential to the pad electrode PD, a current path to ground through intact fuses (FE0 and FE1) may be eliminated so that effects on characterization may be eliminated. This may improve the accuracy in the characterization of the semiconductor memory device 100.

Also, according to the embodiment illustrated in FIG. 2, the pad electrode PD may not be subjected to wire bonding. Thus, the size of the pad electrode PD may be reduced to the design specifications of the test probe. This may limit any increase in chip size caused by providing the pad electrode PD.

A second embodiment of the present invention will now be described.

Figure 3:
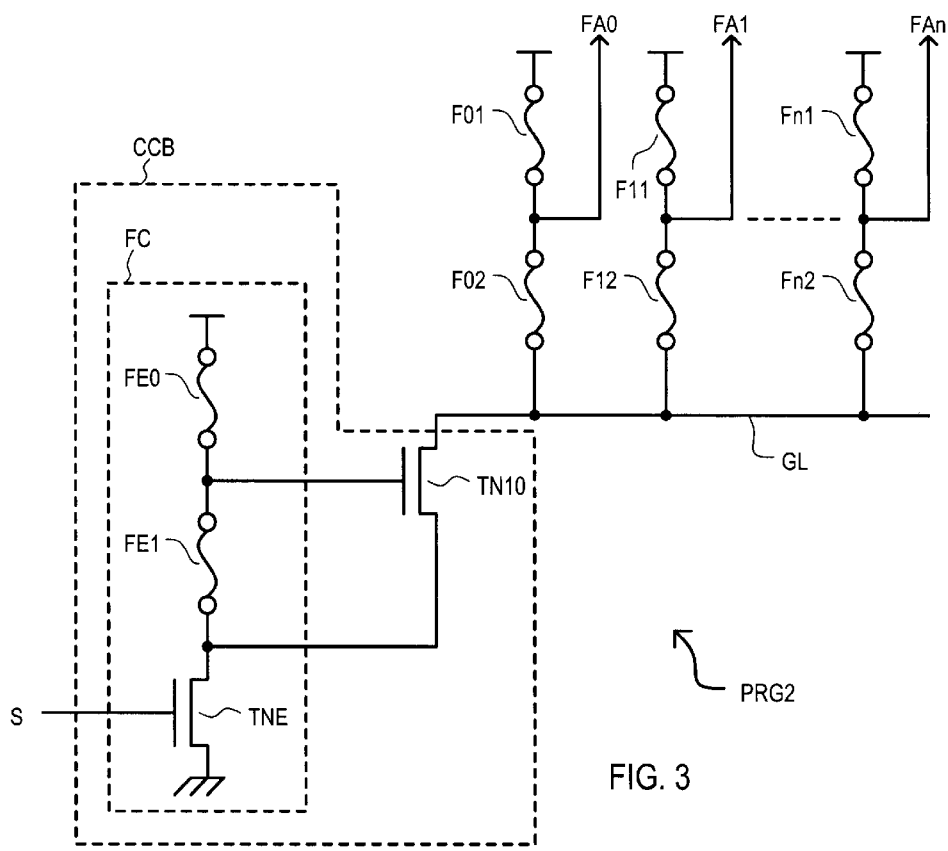
FIG. 3 is a circuit schematic diagram of a defect address storing circuit in accordance with a second embodiment.

In the second embodiment, the structure is similar to the first embodiment of semiconductor memory device 100 illustrated in FIG. 1 except defect address storing circuit PRG illustrated in FIG. 2 may be replaced with a defect address storing circuit PRG2 as illustrated in FIG. 3.

Referring now to FIG. 3, defect address storing circuit PRG2 according to one embodiment is set forth in a circuit schematic diagram. Defect address storing circuit PRG2 may have similar constituents as defect address storing circuit PRG illustrated in FIG. 2 and such constituents may be referred to by the same general reference character.

Defect address storing circuit PRG2 may include fuses (F01–F02 to Fn1–Fn2) and current cutoff circuit CCB. A pair of fuses (F01 and F02) may be connected in series between a power supply and an internal ground wiring GL. Fuse F01 may have one terminal connected to the power supply and another terminal connected to a connection node forming stored defect address FA0. Fuse F02 may have one terminal connected to internal ground wiring GL and another terminal connected to the connection node forming stored defect address FA0. In this way, fuses (F01 and F02) may form a pair of fuses that provide a connection node forming stored defect address FA0. In the same manner, fuses (F11 and F12) to fuses (Fn1 to Fn2) may form pairs of fuses that provide connection nodes forming stored defect addresses (FA1 to FAn), respectively. Each stored defect address may have a pair of fuses connected in series between the power supply and the internal grounding wiring GL.

Current cutoff circuit CCB may include an n-type field effect transistor TN10 and a fuse circuit FC. Fuse circuit FC may include fuses (FE0 and FE1) and an n-type field effect transistor TNE. Fuse FE0 may have one terminal connected to the power supply and another terminal connected to the gate of n-type field effect transistor TN10. Fuse FE1 may have one terminal connected to the gate of n-type field effect transistor TN10 and another terminal connected to a drain of n-type field effect transistor TNE. N-type field effect transistor TNE may have a source connected to ground and a gate connected to receive signal S. N-type field effect transistor TN10 may have a source connected to a drain of n-type field effect transistor TNE. N-type field effect transistor TN10 may have a drain connected to internal ground wiring GL.

Defect address storing circuit PRG2 illustrated in FIG. 3 may exhibit the same essential function as that of the above-mentioned defect address storing circuit PRG.

Signal S may be driven from an external source through an exclusive input terminal or may be a signal internally generated in response to a test mode, as just two examples.

In FIG. 3, current cutoff circuit CCB may cut off a current that passes through fuses (FE0–FE1 and F01–F02 to Fn1–Fn2) during a characterization test to see if defects exist in the semiconductor memory device 100. Also, current cutoff circuit CCB may cut off current that passes through fuses (F01–F02 to Fn1–Fn2) when a redundant circuitry, such as defect address storing circuit PRG2, is not being used.

The operation of the second embodiment illustrated in FIG. 3 will now be described.

First, the operation in the case where the semiconductor memory device 100 is being characterized to determine if defect address storing circuit PRG2 should include a stored defect address that may be used to identify a defective address will be described.

When a test, such as a probe test, is being executed to characterize the semiconductor memory device 100 to determine if there are bad bits that need replaced with redundancy, signal S may be brought to the low level. Signal S may be supplied from a probe from the tester or from an internal circuit on the semiconductor memory device 100 when the test mode is entered. When signal S becomes low, n-type field effect transistor TNE may be turned off.

Because n-type field effect transistor TN10 is connected in series with n-type field effect transistor TNE, internal ground wiring GL may be cut off from the ground. Thus, when a test is being executed to characterize the semiconductor memory device 100 to determine if there are bad bits that need replaced with redundancy, defect address storing circuit PRG2 may not include current paths from the power supply to ground through intact fuses (FE0–FE1 and F01–F02 to Fn1–Fn2). These current paths may be eliminated by turning off n-type field effect transistor TNE.

The operation of defect address storing circuit PRG2 when programmed with a stored defect address will now be described.

The defect address may be obtained through the probe test as described above. The defect address may be programmed in the defect address storing circuit PRG2 to form a stored defect address. Fuses (F01–F02 to Fn1–Fn2) may be selectively cut on the basis of the defect address. Also, fuse FE1 of fuses (FE1 and FE0) within fuse circuit FC may be cut. As a result, the supply voltage may be applied to the gate of n-type field effect transistor TN10 through intact fuse FE0 and n-type field effect transistor TN10 may be turned on.

Also, signal S may be driven high internally. With signal S high, n-type field effect transistor TNE may be turned on. With both n-type field effect transistor TNE and n-type field effect transistor TN10 turned on, internal ground wiring GL may be grounded. Thus, the stored defect addresses (FA0 to FAn) may be output in accordance with the programmed states of the respective fuse pairs (F01–F02 to Fn1–Fn2).

The operation when redundant row RROW is not used to replace a normal row will now be described.

The operation when no defect exists within memory cell array MARY will now be described with reference to FIG. 3. In this case, fuse FE0 out of fuses (FE0 and FE1) within fuse circuit FC may be cut. Also, signal S may be driven high internally. With signal S high, n-type field effect transistor TNE may be turned on. As a result, ground may be applied to the gate of n-type field effect transistor TN10 through intact fuse FE1 and n-type field effect transistor TNE and n-type field effect transistor TN10 may be turned off. In this way, internal ground wire GL may be cut off from ground.

All of the fuses (F01–F02 to Fn1–Fn2) may be left intact. In this case, a logic one may be output from each of the stored defect addresses (FA0 to FAn). This stored defect address may be applied to the address comparing circuit CMP as illustrated in FIG. 1.

However, the defect address comparing circuit CMP may be disabled and this stored defect address may be ignored, so that the coincidence detection signal RE may be fixed to the low level regardless of the value of the row address AX and stored defect addresses (FA0 to FAn). The defect address comparing circuit CMP may be disabled, as just one example, with the signal output from fuse circuit FC to the gate of n-type field effect transistor TN10. With the coincidence detection signal RE at the low level, row decoder XDEC may be enabled to select a normal row within the memory cell array MARY in accordance with the value of the row address AX and the redundant row RROW may remain in the non-selected state. In this way, redundant row RROW may be permanently disabled in the semiconductor memory device 100.

According to the above-mentioned second embodiment illustrated in FIG. 3, a current that flows through the intact fuses (FE0–FE1 and F01–F02 to Fn1–Fn2) to ground may be eliminated in response to the signal S. Thus, it may be unnecessary to provide an exclusive pad electrode and it may be possible to further reduce layout limitations. Also, even if the device has been packaged, the flow through current may be eliminated. Thus, for example, when a defect is being analyzed (such as a burn-in induced defect that has occurred in a characterization test), a current component that may flow through the fuses may be eliminated. This may improve the accuracy of the evaluation of the circuit characteristics, as just one example.

It is also noted that the embodiment of FIG. 3 may include effects as discussed in the embodiment illustrated in FIG. 2.

A third embodiment of the present invention will now be described.

Figure 4:
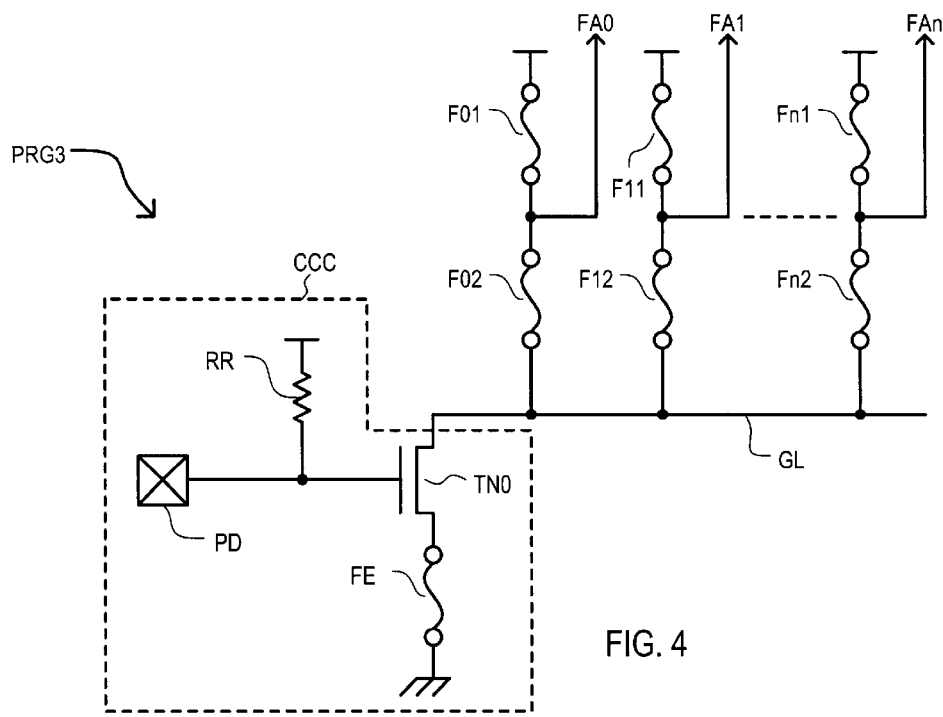
FIG. 4 is a circuit schematic diagram of a defect address storing circuit in accordance with a third embodiment.

In the third embodiment, the structure is similar to the first embodiment of semiconductor memory device 100 illustrated in FIG. 1 except defect address storing circuit PRG illustrated in FIG. 2 may be replaced with a defect address storing circuit PRG3 as illustrated in FIG. 4.

Referring now to FIG. 4, defect address storing circuit PRG3 according to one embodiment is set forth in a circuit schematic diagram. Defect address storing circuit PRG3 may have similar constituents as defect address storing circuit PRG illustrated in FIG. 2 and such constituents may be referred to by the same general reference character.

Defect address storing circuit PRG3 may include fuses (F01–F02 to Fn1–Fn2) and current cutoff circuit CCC. A pair of fuses (F01 and F02) may be connected in series between a power supply and an internal ground wiring GL. Fuse F01 may have one terminal connected to the power supply and another terminal connected to a connection node forming stored defect address FA0. Fuse F02 may have one terminal connected to internal ground wiring GL and another terminal connected to the connection node forming stored defect address FA0. In this way, fuses (F01 and F02) may form a pair of fuses that provide a connection node forming stored defect address FA0. In the same manner, fuses (F11 and F12) to fuses (Fn1 to Fn2) may form pairs of fuses that provide connection nodes forming stored defect addresses (FA1 to FAn), respectively. Each stored defect address may have a pair of fuses connected in series between the power supply and the internal grounding wiring GL.

Current cutoff circuit CCC may include an n-type field effect transistor TN0, resistor RR, fuse FE, and pad electrode PD. Resistor RR may have one terminal connected to a power supply and another terminal commonly connected to the gate of n-type field effect transistor TN0 and pad electrode PD. Fuse FE may have one terminal connected to the ground and another terminal connected to the source of n-type field effect transistor TN0. N-type field effect transistor TN0 may have a drain connected to internal ground wiring GL.

Defect address storing circuit PRG3 illustrated in FIG. 4 may exhibit the same essential function as that of the above-mentioned defect address storing circuit PRG illustrated in FIG. 2.

Current cutoff circuit CCC may cut off a current that passes through fuses (F01–F02 to Fn1–Fn2) during a characterization test to see if defects exist in the semiconductor memory device 100. Also, current cutoff circuit CCC may cut off current that passes through fuses (F01–F02 to Fn1–Fn2) when a redundant circuitry, such as defect address storing circuit PRG3, is not being used.

The operation of the third embodiment illustrated in FIG. 4 will now be described.

First, the operation in the case where the semiconductor memory device 100 is being characterized to determine if defect address storing circuit PRG3 should include a stored defect address that may be used to identify a defective address will be described.

When a test, such as a probe test, is being executed to characterize the semiconductor memory device 100 to determine if there are bad bits that need replaced with redundancy, a probe from the tester may be brought into electrical contact with pad electrode PD. In this way, the tester may apply a low level to the pad electrode PD. As a result, a low level is applied to the gate of n-type field effect transistor TN0. Thus, n-type field effect transistor TN0 may be turned off. Because n-type field effect transistor TN0 is connected to supply the ground potential to internal ground wiring GL, internal ground wiring GL may be cut off from the ground. Thus, when a test is being executed to characterize the semiconductor memory device 100 to determine if there are bad bits that need replaced with redundancy, defect address storing circuit PRG3 may not include current paths from the power supply to ground through intact fuses (FE and F01–F02 to Fn1–Fn2). These current paths may be eliminated by turning off n-type field effect transistor TN0.

The operation of defect address storing circuit PRG3 when programmed with a stored defect address will now be described.

The defect address may be obtained through the probe test as described above. The defect address may be programmed in the defect address storing circuit PRG3 to form a stored defect address. Fuses (F01–F02 to Fn1–Fn2) may be selectively cut on the basis of the defect address. Also, fuse FE may be intact.

No signal may be externally applied to pad electrode PD. Thus, the supply potential may be applied to the gate of n-type field effect transistor TN0 through resistor RR and n-type field effect transistor TN0 may be turned on. With n-type field effect transistor TN0 turned on and fuse FE0 intact, internal ground wiring GL may be grounded. Thus, the stored defect addresses (FA0 to FAn) may be output in accordance with the programmed states of the respective fuse pairs (F01–F02 to Fn1–Fn2).

The operation when redundant row RROW is not used to replace a normal row will now be described.

The operation when no defect exists within memory cell array MARY will now be described with reference to FIG. 4. In this case, fuse FE may be cut. In this way, internal ground wire GL may be cut off from ground.

All of the fuses (F01–F02 to Fn1–Fn2) may be left intact. In this case, a logic one may be output from each of the stored defect addresses (FA0 to FAn). This stored defect address may be applied to the address comparing circuit CMP as illustrated in FIG. 1. However, the defect address comparing circuit CMP may be disabled and this stored defect address may be ignored, so that the coincidence detection signal RE may be fixed to the low level regardless of the value of the row address AX and stored defect addresses (FA0 to FAn). With the coincidence detection signal RE at the low level, row decoder XDEC may be enabled to select a normal row within the memory cell array MARY in accordance with the value of the row address AX and the redundant row RROW may remain in the non-selected state. In this way, redundant row RROW may be permanently disabled in the semiconductor memory device 100.

In accordance with the third embodiment as illustrated in FIG. 4, the same essential function as that of the above-mentioned first and second embodiments may be realized with a minimal number of elements.

A fourth embodiment of the present invention will now be described.

Figure 5:
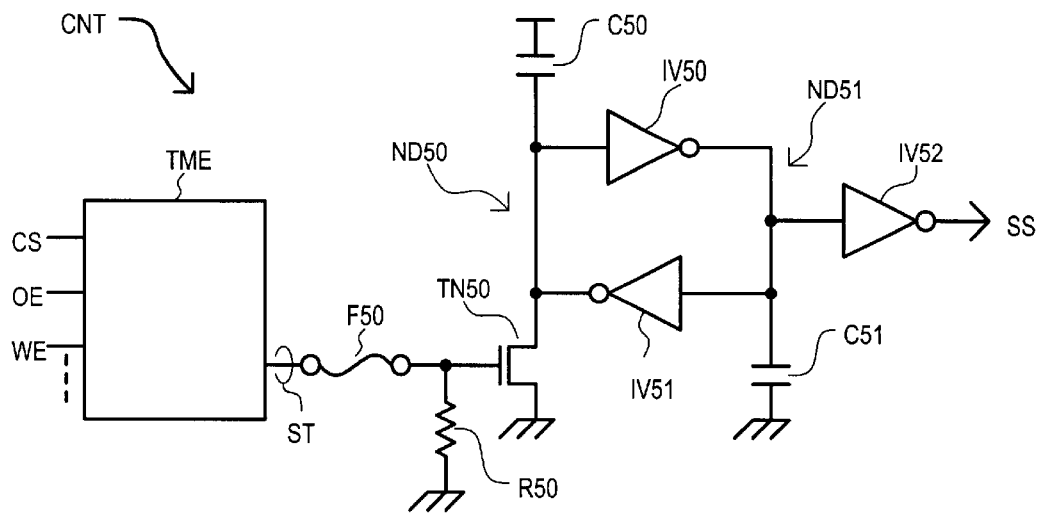
FIG. 5 is a circuit schematic diagram of a state control circuit according to a fourth embodiment.

Referring now to FIG. 5, a circuit schematic diagram of a state control circuit according to a fourth embodiment is set forth and given the general reference character CNT.

In the above-mentioned first embodiment as illustrated in FIG. 2, the pad electrode PD and load resistor RR may provide the level or state of signal SS in accordance with whether or not a low level is applied to the pad electrode PD. In this way, n-type field effect transistor TN0 may be controlled. However, in the fourth embodiment illustrated in FIG. 5, pad electrode PD may not be provided. Instead, the signal SS may be produced by a state control circuit CNT as illustrated in FIG. 5. Signal SS may then be used to control the state of n-type field effect transistor TN0.

State control circuit CNT may include a test mode entry circuit TME, a fuse F50, a resistor R50, an n-type field effect transistor TN50, capacitors (C50 and C51), and inverters (IV50, IV51, and IV52). Test mode entry circuit TME may receive control signals (CS, OE, WE, etc.) and may generate a test mode signal ST. Fuse F50 may have one terminal connected to receive the test mode signal ST and another terminal commonly connected to a terminal of resistor R50 and a gate of n-type field effect transistor TN50. Resistor R50 may have another terminal connected to ground. N-type field effect transistor TN50 may have a source connected to ground and a drain connected to internal node ND50. Capacitor C50 may have one terminal connected to the power supply and another terminal connected to internal node ND50. Inverter IV50 may have an input connected to internal node ND50 and an output connected to internal node ND51. Inverter IV51 may have an input connected to internal node ND51 and an output connected to internal node ND50. Capacitor C51 may have one terminal connected to ground and another terminal connected to internal node ND51. Inverter IV52 may have an input connected to internal node ND51 and an output connected to generate signal SS.

Test mode entry circuit TME may generate the test mode signal ST on when the combination of control signals, such as chip select signal CS, output enable signal OE, and write enable signal WE, satisfy a predetermined condition.

Inverters (IV50 and IV51) may form a flip-flop. Current capacity of n-type field effect transistor TN50 may be greater than the current capacity of inverter IV51. In this way, n-type field effect transistor TN50 may set the state of the flip-flop formed by inverters (IV50 and IV51).

Reset signal ST output from test mode entry circuit TME may be provided to the gate of n-type field effect transistor TN50 through fuse F50. When fuse F50 is cut or blown, test mode signal ST may not have any affect on state control circuit CNT and may be considered invalid. When fuse F50 is cut, the gate of n-type field effect transistor TN50 may be pulled to ground through resistor R50 and n-type field effect transistor TN50 may be turned off.

The operation of the fourth embodiment will now be described.

First, the operation in the case where the semiconductor memory device 100 is being characterized to determine if defect address storing circuit PRG (illustrated in FIG. 2) should include a stored defect address that may be used to identify a defective address will be described.

Referring once again to FIG. 5, when a test is being executed to characterize the semiconductor memory device 100 to determine if there are bad bits that need replaced with redundancy, fuse F50 may be intact. Control signals (CS, OE, WE, etc.) may be set in the predetermined state and test mode entry circuit TME may generate test mode signal ST having a high level. Thus, n-type field effect transistor TN50 may be turned on.

With n-type field effect transistor TN50 turned on, internal node N50 may be pulled low. Flip-flop formed by inverters (IV50 and IV51) may latch a low level at internal node ND50 and a high level at internal node ND51 and inverter IV52 may provide signal SS having a low level.

With signal SS at a low level, n-type field effect transistor TN0 (illustrated in FIG. 2) may be turned off. Thus, when a test is being executed to characterize the semiconductor memory device 100 to determine if there are bad bits that need replaced with redundancy, defect address storing circuit PRG may not include current paths from the power supply to ground through intact fuses (F01–F02 to Fn1–Fn2). These current paths may be eliminated by turning off n-type field effect transistors TN0 by providing signal SS having a low level supplied by state control circuit CNT illustrated in FIG. 5.

The normal operation of state control circuit CNT illustrated in FIG. 5 will now be described.

After the characterization test to determine if the semiconductor memory device 100 has defective portions has been completed, fuse F50 may be cut. As a result, test mode sigal ST output from test mode entry circuit TME may be disconnected from the gate of n-type field effect transistor TN50 and may be considered invalid. In this way, the test mode may be prevented from being erroneously entered. Referring now to FIG. 2, semiconductor memory devices that have been determined to be good products with no defect may leave fuses (F01–F02 to Fn1–Fn2) intact and fuse FE0 may be cut to disable defect address storing circuit PRG. However, prior to packaging, the semiconductor memory devices that have been determined to have fixable defects may have fuses (F01–F02 to Fn1–Fn2) selectively cut to correspond with a defective address to provide a stored defective address. At the same time, fuse FE1 may be cut to enable defect address storing circuit PRG.

Referring once again to FIG. 5, when fuse F50 is cut, the gate of n-type field effect transistor TN50 may be pulled to ground through resistor R50 and n-type field effect transistor TN50 may be turned off. When the power supply initially turns on, capacitor C50 may cause internal node ND50 to follow the power supply to the high level. At the same time, capacitor C51 may cause internal node ND51 to follow ground to the low level. In this way, the latch formed by inverters (IV50 and IV51) may power-up in a manner so that node ND50 may be latched high and internal node ND51 may be latched low. Thus, signal SS may be latched at a high level.

With signal SS at a high level, n-type field effect transistor TN0, illustrated in FIG. 2, may be fixed in the on state. In this way, defect address storing circuit PRG as illustrated in FIG. 2, may properly function.

A fifth embodiment of the present invention will now be described.

Figure 6:
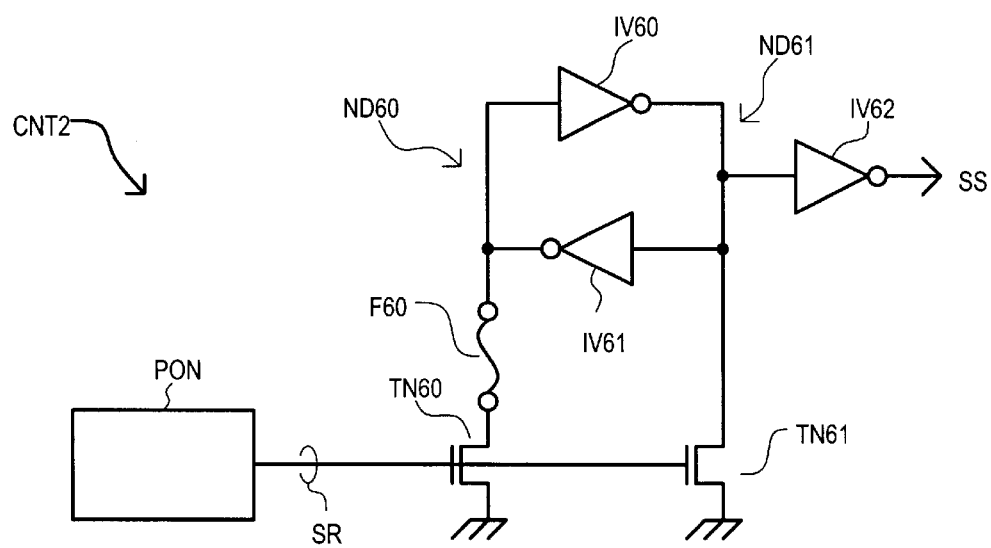
FIG. 6 is a circuit schematic diagram of a state control circuit according to a fifth embodiment.

Referring now to FIG. 6, a circuit schematic diagram of a state control circuit according to a fifth embodiment is set forth and given the general reference character CNT2.

In the above-mentioned fourth embodiment as illustrated in FIG. 5, the test mode may be entered on the basis of external control signals (CS, OE, WE, etc.) and a state may be latched within a flip flop in the state control circuit CNT. However, in the fifth embodiment, the rising of the power supply may be detected to set an initial state within a flip-flop in the state control circuit CNT2 illustrated in FIG. 6.

State control circuit CNT2 may include a power on reset circuit PON, a fuse F60, n-type field effect transistors (TN60 and TN61), and inverters (IV60, IV61, and IV62). Power on reset circuit PON may generate a reset signal SR. N-type field effect transistor TN60 may have a source connected to ground, a drain connected to a terminal of fuse F60 and a gate connected to receive reset signal SR. Fuse F60 may have another terminal connected to internal node ND60. Inverter IV60 may have an input connected to internal node ND60 and an output connected to internal node ND61. Inverter IV61 may have an input connected to internal node ND61 and an output connected to internal node ND60. N-type field effect transistor TN61 may have a source connected to ground, a drain connected to internal node ND61, and a gate connected to receive reset signal SR. Inverter IV62 may have an input connected to internal node ND61 and an output connected to generate signal SS.

Inverters (IV60 and IV61) may form a flip-flop. Current capacity of n-type field effect transistor TN60 may be greater than the current capacity of inverter IV61 and current capacity of n-type field effect transistor TN61 may be greater than the current capacitor of inverter IV60. In this way, n-type field effect transistors (TN60 and TN61) may set the state of the flip-flop formed by inverters (IV60 and IV61).

Signal SS may then be used to control the state of n-type field effect transistor TN0 of defect address storing circuit PRG illustrated in FIG. 2. Note that in the fifth embodiment, the source of n-type field effect transistor TN0 may be grounded. Thus, n-type field effect transistor TN1 and fuse circuit FC may be omitted.

Figure 7:
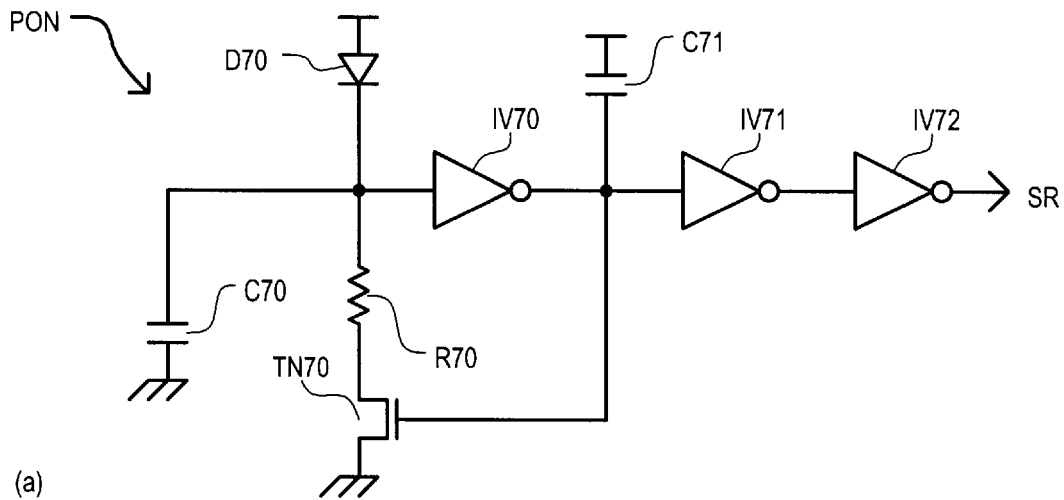
FIG. 7(a) is a circuit schematic diagram of a power on reset circuit according to the fifth embodiment.
FIG. 7(b) is a graph of a reset signal versus power supply potential in a power up operation.
Figure 7:
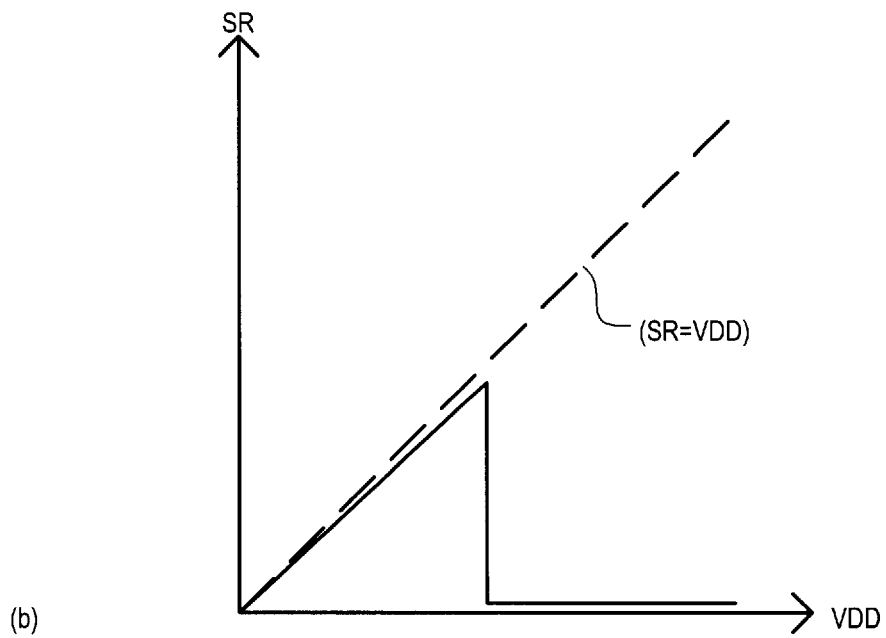

Referring now to FIG. 7(a), a circuit schematic diagram of power on reset circuit PON according to one embodiment is set forth.

FIG. 7(b) is a graph of reset signal SR versus power supply potential in a power up operation.

Power on reset circuit PON may output a pulse-like reset signal SR in response to the detection of the turn on of the power supply. Power on reset circuit PON may be configured essentially as a monostable flip-flop, such that, after the power supply turns on, the reset signal SR may temporarily follow the rise of the power supply potential.

Power on reset circuit PON may include capacitors (C70 and C71), n-type field effect transistor TN70, diode D70, and inverters (IV70, IV71, and IV72). Capacitor C70 may have one terminal connected to ground and another terminal commonly connected to the cathode of diode D70, input of inverter IV70, and a terminal of resistor R70. N-type field effect transistor TN70 may have a source connected to ground, a drain connected to another terminal of resistor R70, and a gate connected to receive the output of inverter IV70. Diode D70 may have an anode connected to the power supply. Capacitor C71 may have one terminal connected to the power supply and another terminal connected to the output of inverter IV70. Inverter IV71 may have an input connected to receive the output of inverter IV70 and an output connected to the input of inverter IV72. Inverter IV72 may provide reset signal SR as an output.

Inverter IV70, n-type field effect transistor TN70, and resistor 70 may constitute the monostable flip-flop. Inverters (IV70, IV71, and IV72) may be complementary metal oxide semiconductor (CMOS) inverters, as just one example.

The operation of power on reset circuit PON will now be briefly described.

Note that, an inverter may not operate normally when the supply voltage is near 0V due to the gate threshold voltage of field effect transistors constituting the inverter. However, for simplification of description, inverters (IV70 to IV72) may be considered to operate over a voltage rage from 0V to the supply voltage.

Before the power is supplied to the semiconductor memory device 100, the power supply potential may be in the vicinity of the ground potential. As power is supplied to the semiconductor memory device 100, the power supply potential begins to rise. Due to the capacitor C71, the output of inverter IV70 may rise essentially with the power supply potential.

However, due to capacitor C70, the input of inverter IV70 may essentially be held at the ground potential. When the potential of the output of inverter IV70 reaches a threshold voltage of n-type field effect transistor TN70, n-type field effect transistor TN70 may be turned on. In this way, a current path to ground from the input of inverter IV70 through resistor R70 and n-type field effect transistor TN70 may be established to hold the input of inverter IV70 at essentially the ground potential. As a result, a feedback system including inverter IV70, n-type field effect transistor TN70, and resistor R70 may latch the power-up levels and a high level may be provided on reset signal SR at the output of inverter IV72.

When the power supply potential rises further to provide a potential difference between the anode and cathode of diode D70 that exceeds the threshold voltage of the diode D70 (for example, the barrier potential of the p-n junction), a current may flow from the power supply through the diode to charge capacitor C70 so that the input of inverter IV70 may follow the rise of the supply potential. When the potential at the input of inverter IV70 exceeds the threshold value of inverter IV70, inverter IV70 may provide a low output and n-type field effect transistor TN70 may be turned off. As a result, the reset signal SR may be driven low. In this way, power on reset circuit PON may provide a reset signal SR maintained at a high level in accordance with the rise of the supply potential and thereafter transition to a low level in a certain period after the power supply provides a potential that may be at least a threshold voltage of diode D70 above the threshold voltage of inverter IV70. Thus, a pulse-like signal as illustrated in FIG. 7(b) may be provided as a reset signal SR during power up.

The operation of the fifth embodiment will now be described with reference to FIG. 6.

First, the operation in the case where the semiconductor memory device 100 is being characterized to determine if defect address storing circuit PRG (illustrated in FIG. 2) should include a stored defect address that may be used to identify a defective address will be described.

Referring now to FIG. 6, upon providing power to the semiconductor memory device 100 (FIG. 1), power on reset circuit PON may detect the turn on of the power supply and may output the reset signal SR having a high level to the gates of n-type field effect transistors (TN60 and TN61). When the reset signal SR is exceeds a threshold voltage of an n-type field effect transistor, n-type field effect transistors (TN60 and TN61) may turn on. Because fuse F60 is intact, n-type field effect transistor TN60 may pull internal node ND60 down. At the same time, n-type field effect transistor TN61 may pull internal node ND61 down. At the same time, inverters (IV60 and IV61) may respectively, try to pull internal nodes (ND61 and ND60) up.

In this example, the potential of internal node ND60 may be determined by the current capacity of inverter IV61 and the current capacity of n-type field effect transistor TN60. The potential of internal node ND61 may be determined by the current capacity of inverter IV60 and the current capacity of n-type field effect transistor TN61. The current capacities of inverters (IV60 and IV61) may be designed to be equal. However, the current capacity of n-type field effect transistor TN60 may be designed to be larger than the current capacity of n-type field effect transistor TN61. Thus, the potential of internal node ND60 may be lower than the potential of internal node ND61.

When the supply potential rises to a predetermined level, reset signal SR transitions low and n-type field effect transistors (TN60 and TN61) may be turned off. Because at this time the potential at internal node ND60 may be lower than the potential at internal node ND61, the flip-flop formed by inverters (IV60 and IV61) may stabilize in a state where node ND60 may be low and internal node ND61 may be high. In this way, signal SS may be low and n-type field effect transistor TN0 (FIG. 2) may be turned off. Thus, when a test is being executed to characterize the semiconductor memory device 100 to determine if there are bad bits that need replaced with redundancy, defect address storing circuit PRG may not include current paths from the power supply to ground through intact fuses (F01–F02 to Fn1–Fn2). These current paths may be eliminated by turning off n-type field effect transistors TN0 by providing signal SS having a low level supplied by state control circuit CNT2 illustrated in FIG. 6.

The operation of the fifth embodiment when defect address storing circuit PRG is programmed with a stored defect address will now be described.

The defect address may be obtained through the probe test. The defect address may be programmed in the defect address storing circuit PRG to form a stored defect address. Fuses (F01–F02 to Fn1–Fn2) may be selectively cut on the basis of the defect address. Also, fuse F60 in state control circuit CNT may be cut may be cut. When power on reset circuit PON outputs the reset signal SR as power is initially applied to the semiconductor memory device 100, n-type field effect transistors (TN60 and TN61) may be turned on. Because fuse F60 is cut, internal node ND60 may not be pulled low by n-type field effect transistor TN60. However, internal node ND61 is still pulled low by n-type field effect transistor TN61.

As a result, the flip-flop formed by inverters (IV60 and IV61) may stabilize in a state where node ND60 may be high and internal node ND61 may be low. In this way, signal SS may be high and n-type field effect transistor TN0 (FIG. 2) may be turned on. Thus, within defect address storing circuit PRG, the stored defect addresses (FA0 to FAn) may be output in accordance with the programmed states of the respective fuse pairs (F01–F02 to Fn1–Fn2).

The operation when redundant row RROW is not used to replace a normal row will now be described.

In this case, fuse F60 may remain intact. Also, because it is unnecessary to program the defect address, all of the fuses (F01–F02 to Fn1–Fn2) may be left intact. When power on reset circuit PON outputs the reset signal SR as power is initially applied to the semiconductor memory device 100, the operation of state control circuit CNT2 may be the same as the case where the semiconductor memory device 100 is being characterized to determine if defects exist. Thus, inverter IV62 may output signal SS at a low level and n-type field effect transistor TN0 (FIG. 2) may be turned off. Thus, the redundant circuitry may not function.

According to the fifth embodiment, a current that flows through the intact fuses (F01–F02 to Fn1–Fn2) to ground in defect address storing circuit PRG may be eliminated by controlling the n-type field effect transistor TN0 based on a power-up state determination without applying external signal conditions as in the above-mentioned first to fourth embodiments.

Whether or not the redundant circuit is enabled to function may be set by fuse F60 only. In this way, the number of fuses required other than fuses for programming the stored defect address may be suppressed to a minimum.

A sixth embodiment of the present invention will now be described.

In the above-mentioned first embodiment, there is illustrated a single defect address storing circuit PRG that may be used to store an address corresponding to a single defect address. However, in the sixth embodiment, a structure is shown so that a plurality of defect address may be stored to provide redundant replacement for a plurality of defective addresses.

Figure 8:
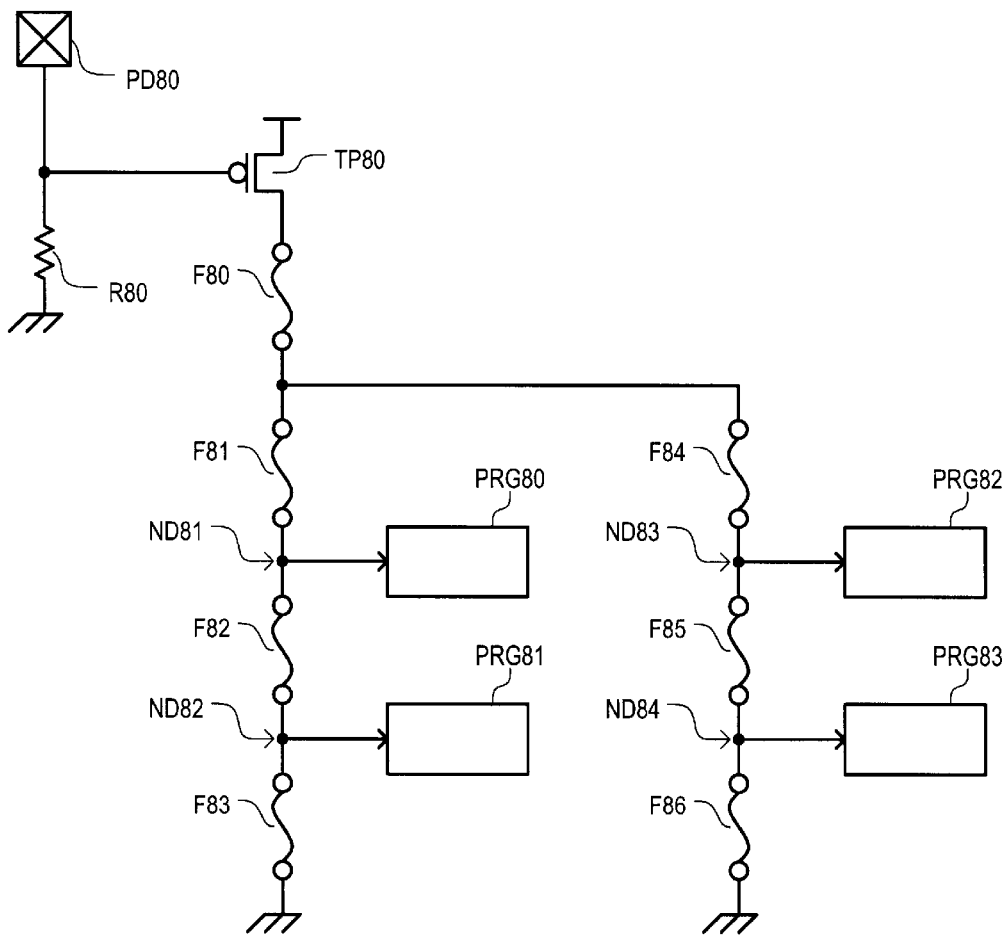
FIG. 8 is a circuit schematic diagram of a defect address storing circuit according to a sixth embodiment.
Figure 9:
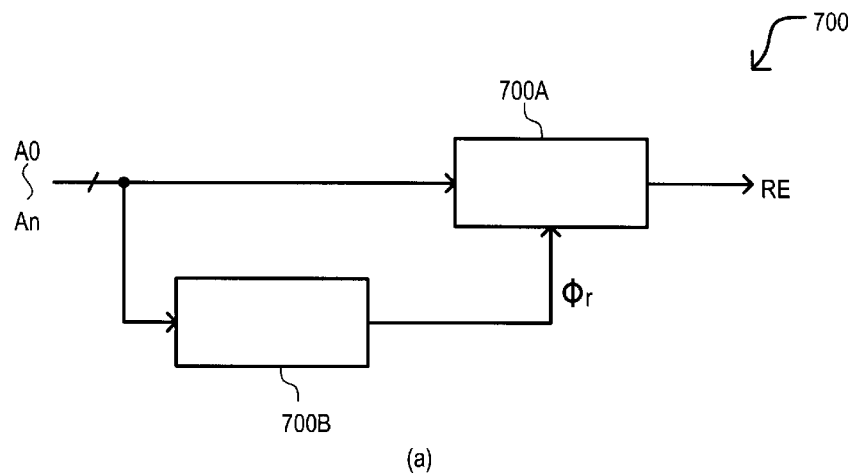
FIG. 9(a) is a block schematic diagram of a conventional defect detecting circuit.
FIG. 9(b) is a circuit diagram of a conventional coincidence detecting circuit.
Figure 9:
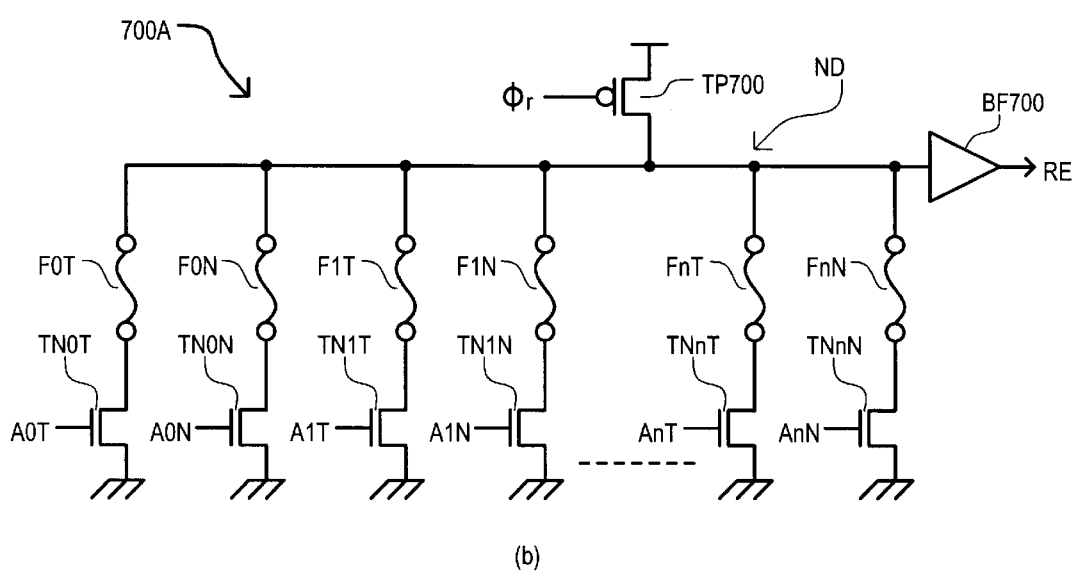
Figure 10:
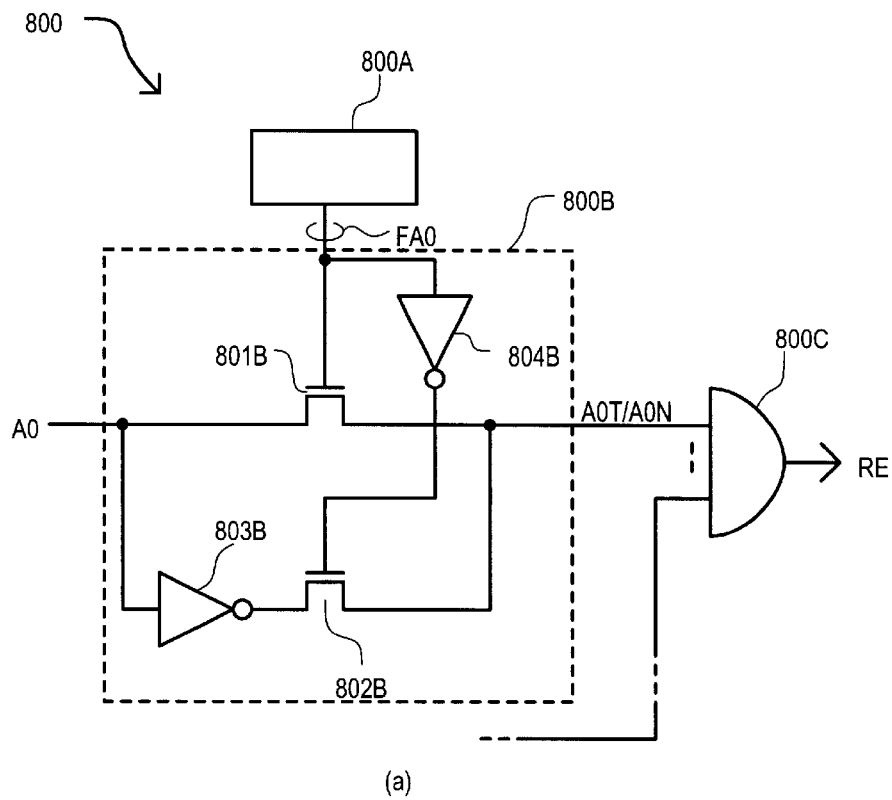
FIG. 10(a) is a circuit schematic diagram of a second conventional defect detecting circuit.
FIG. 10(b) is a circuit schematic diagram of a conventional fuse circuit.
Figure 10:
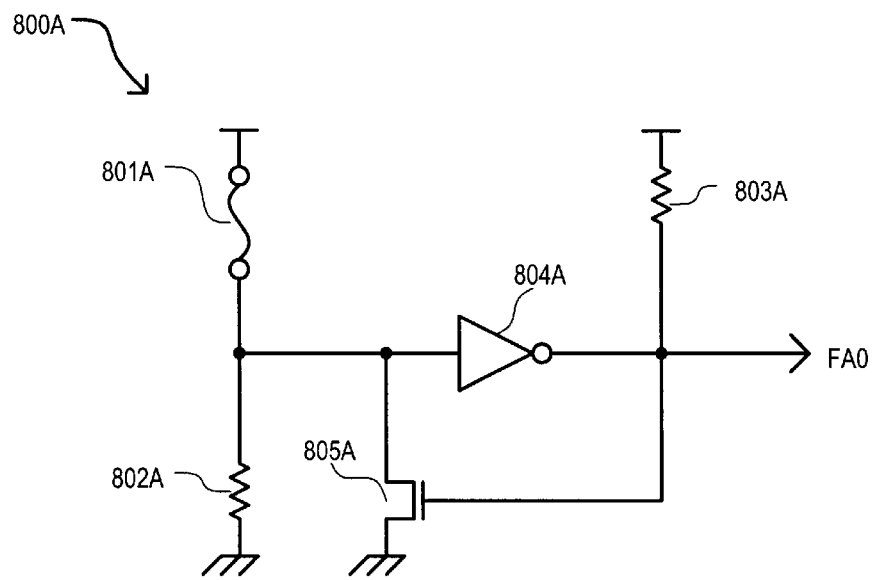
Figure 11:
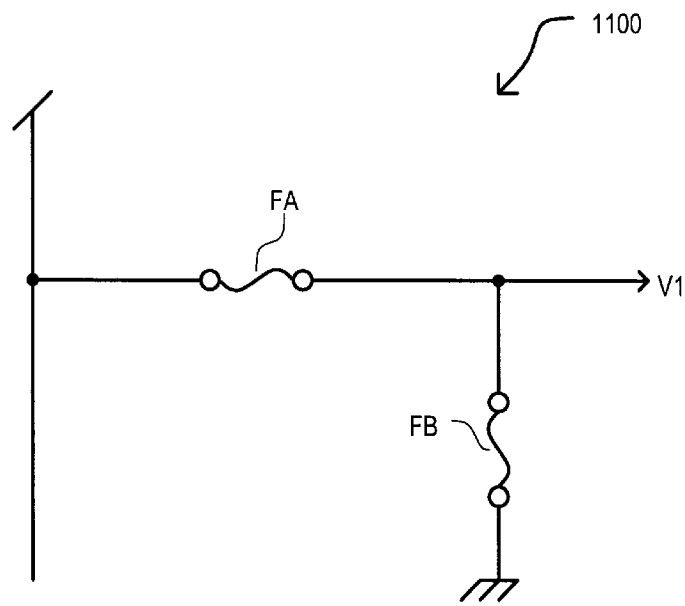
FIG. 11 is a circuit schematic diagram of a conventional fuse circuit.
Figure 12:
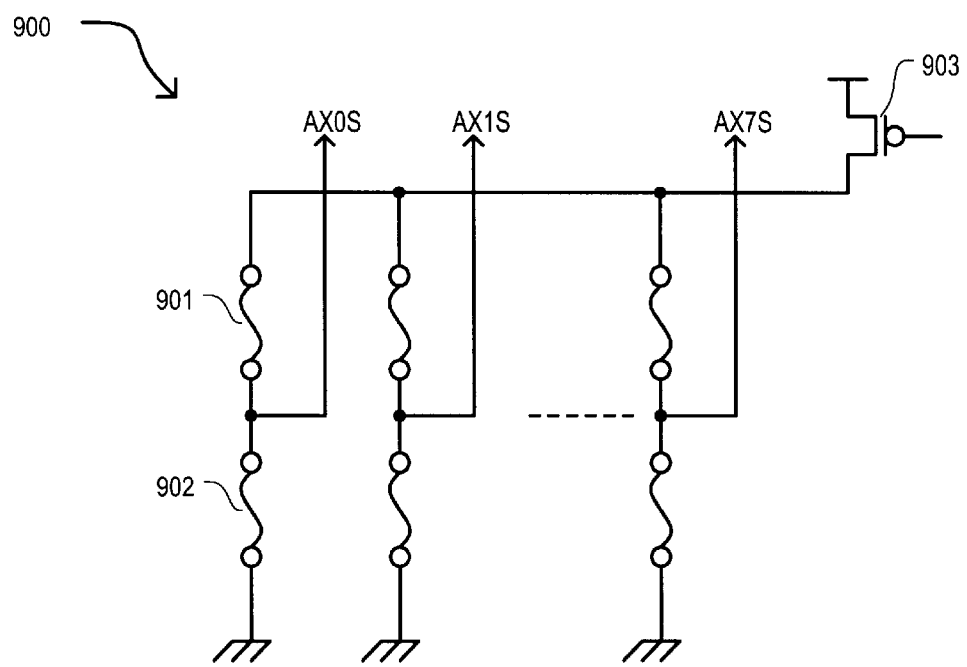
FIG. 12 is a circuit schematic diagram of a conventional address program circuit.

Referring now to FIG. 8, a circuit schematic diagram of a defect address storing circuit is set forth.

The defect address storing circuit of FIG. 8 may include a pad electrode PD80, a load resistor R80, a p-type field effect transistor TP80, fuses (F81 to F86), and address program circuits (PRG80 to PRG83). The address program circuits (PRG80 to PRG83) may be configured similarly to the defect address storing circuit PRG of FIG. 2, except that pad electrode PD, resistor RR, n-type field effect transistor TN0, and fuse circuit FC may be omitted. Also, n-type field effect transistor TN1 may be connected between internal ground wiring GL and ground.

Pad electrode PD80 may be connected to the gate of p-type field effect transistor TP80. Load resistor R80 may have one terminal connected to ground and another terminal connected to the gate of p-type field effect transistor TP80. P-type field effect transistor TP80 may have a source connected to the power supply and a drain connected one terminal of fuse F80. Fuse F80 may have another terminal commonly connected to one terminal of fuse F81 and one terminal of fuse F84. Fuse F81 may have another terminal connected to node ND81. Fuse F82 may have one terminal connected to node ND81 and another terminal connected to node ND82. Fuse F83 may have one terminal connected to node ND82 and another terminal connected to ground. Fuse F84 may have another terminal connected to node ND83. Fuse F85 may have one terminal connected to node ND83 and another terminal connected to node ND84. Fuse F86 may have one node connected to node ND84 and another node connected to ground.

In this way, fuses (F81 to F83) may be connected in parallel with fuses (F84 to F86).

Address program circuit PRG80 may be connected to node ND81 formed at the connection point of fuses (F81 and F82). Address program circuit PRG81 may be connected to node ND82 formed at the connection point of fuses (F82 and F83). Address program circuit PRG82 may be connected to node ND83 formed at the connection point of fuses (F84 and F85). Address program circuit PRG83 may be connected to node ND84 formed at the connection point of fuses (F85 and F86). In this way, nodes (ND81 to ND84) may be respectively connected to the gate of the corresponding n-type field effect transistor TN1 (as previously mentioned above) of the address program circuits (PRG80 to PRG83), respectively.

The operation of the sixth embodiment will now be described.

First, the operation in the case where the semiconductor memory device 100 is being characterized to determine if any of address program circuits (PRG80 to PRG83) should include stored defect addresses that may be used to identify a defective address will be described.

When a test is being executed to characterize the semiconductor memory device 100 to determine if there are bad bits that need replaced with redundancy, a high level may be supplied to pad electrode PD80. Thus, p-type field effect transistor TP80 may be turned off. In this case, the nodes (ND81 to ND84) may be provided with the ground potential through intact fuses and the corresponding n-type field effect transistor TN1 within each address program circuit (PRG80 to PRG83) may be turned off. Thus, each address program circuit (PRG80 to PRG83) may not include current paths from the power supply to ground through intact fuses (F01–F02 to Fn1–Fn2).

The operation when no redundant row RROW is used to replace a normal row will now be described.

The operation when no defect exists within memory cell array MARY will now be described with reference to FIG. 8. In this case, fuse F80 may be cut. In this way, p-type field effect transistor TP80 may not provide the power supply level to address program circuits (PRG80 to PRG83). Thus, the nodes (ND81 to ND84) may be provided with the ground potential through intact fuses and the corresponding n-type field effect transistor TN1 within each address program circuit (PRG80 to PRG83) may be turned off. Thus, each address program circuit (PRG80 to PRG83) may not include current paths from the power supply to ground through intact fuses (F01–F02 to Fn1–Fn2).

The operation of defect address storing circuit of FIG. 8 when at least one address program circuit (PRG80 to PRG83) is programmed with a stored defect address will now be described.

The defect address or addresses may be obtained through the probe test. Fuse F80 may be left intact and fuses (F81 to F86) may be selectively cut in accordance with the number of defect addresses to be stored.

For example, when the number of defects is one and the defect address is to be stored in the address program circuit PRG80, fuses (F82 and F84) may be cut. As a result, the supply potential may be provided to node ND81 and the n-type field effect transistor TN1 corresponding to address program circuit PRG80 may be turned on and the corresponding stored defect addresses (FA0 to FAn) may be output in accordance with the programmed states of the corresponding respective fuse pairs (F01–F02 to Fn1–Fn2). Also, the ground potential may be applied to nodes (ND82, ND83, and ND84) and the respective address program circuits (PRG81, PRG82, and PRG83) connected to those nodes may not include current paths from the power supply to ground through the respective intact fuses (F01–F02 to Fn1–Fn2).

When the number of defects is two and the defect address is to be stored in the address program circuits (PRG80 and PRG81), fuses (F83 and F84) may be cut. As a result, the supply potential may be provided to nodes (ND81 and ND82) and the n-type field effect transistors TN1 corresponding to address program circuits (PRG80 and PRG81) may be turned on and the corresponding stored defect addresses (FA0 to FAn) in each address program circuits (PRG80 and PRG81) may be output in accordance with the programmed states of the corresponding respective fuse pairs (F01–F02 to Fn1–Fn2). In this way, two different stored defect addresses may be provided. Also, the ground potential may be applied to nodes (ND83 and ND84) and the respective address program circuits (PRG82 and PRG83) connected to those nodes may not include current paths from the power supply to ground through the respective intact fuses (F01–F02 to Fn1–Fn2).

When the number of defects is three and the defect address is to be stored in the address program circuits (PRG80, PRG81 and PRG82), fuses (F83 and F85) may be cut. As a result, the supply potential may be provided to nodes (ND81, ND82 and ND83) and the n-type field effect transistors TN1 corresponding to address program circuits (PRG80, PRG81 and PRG82) may be turned on and the corresponding stored defect addresses (FA0 to FAn) in each address program circuits (PRG80, PRG81 and PRG82) may be output in accordance with the programmed states of the corresponding respective fuse pairs (F01–F02 to Fn1–Fn2). In this way, three different stored defect addresses may be provided. Also, the ground potential may be applied to node ND84 and the respective address program circuit PRG83 connected to those nodes may not include current paths from the power supply to ground through the respective intact fuses (F01–F02 to Fn1–Fn2).

When the number of defects is four and the defect address is to be stored in the address program circuits (PRG80, PRG81, PRG82 and PRG83), fuses (F83 and F86) may be cut. As a result, the supply potential may be provided to nodes (ND81, ND82, ND83 and ND84) and the n-type field effect transistors TN1 corresponding to address program circuits (PRG80, PRG81, PRG82, and PRG83) may be turned on and the corresponding stored defect addresses (FA0 to FAn) in each address program circuits (PRG80, PRG81, PRG82, and PRG83) may be output in accordance with the programmed states of the corresponding respective fuse pairs (F01–F02 to Fn1–Fn2). In this way, four different stored defect addresses may be provided.

According to the sixth embodiment illustrated in FIG. 8, the number of fuses for controlling the n-type field effect transistors TN1 in a plurality of address program circuits (PRG80 to PRG83) may be reduced.

It is understood that the embodiments described above are exemplary and the present invention should not be limited to those embodiments. Specific structures should not be limited to the described embodiments.

For example, in the above-mentioned first to sixth embodiments, n-type field effect transistors (TN0, TN1, and TN10) and fuse FE used for current cut off may be disposed on the ground side with respect to fuses (F01–F02 to Fn1–Fn2) in which addresses may be programmed. However, the present invention should not be limited to such a structure, as just one example, corresponding p-type field effect transistors may be disposed at the power supply side.

Also in the above-mentioned first and third embodiments, pad electrode PD may be directly connected to the gate of n-type field effect transistor TN0 to provide current cut off. However, the present invention should not be limited as such. Circuitry, such as a resistor or a capacitor for protection against electrostatic destruction, may be disposed between the pad electrode PD and the gate or n-type field effect transistor, as just one example.

Additionally, in the fourth embodiment, node ND50 may be driven to the low level by n-type field effect transistor TN50. Alternatively, node ND51 may be driven to the high level, or both nodes (ND50 and ND51) may be driven accordingly at the same time, as just a few examples.

In addition, in the fifth embodiment, nodes (ND60 and ND61) are driven toward the low potential by n-type field effect transistors (TN60 and TN61), respectively. However, nodes (ND60 and ND61) may be driven toward the high potential using p-type field effect transistors in a similar manner, as just one example.

Also, in the sixth embodiment, p-type field effect transistor TP80 used for current cut off and fuse F80 are disposed at the power supply side and p-type field effect transistor TP80 may be turned off when the characterization test is performed. However, the present invention should not be limited as such and an n-type field effect transistor and a fuse disposed at the ground side may be used, as just one example.

The present invention may include the following advantages.

According to the present invention, the defect address storing circuit may include first and second fuses connected in series between a power supply and ground and may be selectively (complementarily) cut off in accordance with a desired logical value of the defect address. A current cut off circuit may be included that may cut off a current that passes through the first and second fuses when characterization of the semiconductor device is performed. With such a structure, the redundant replacement may be conducted with a low current consumption and at a high speed. Also, during the characterization of the semiconductor device is performed, abnormal current may be eliminated. In this way, the accuracy of the characterization of the semiconductor device may be improved.

The current cut off circuit may further include a function of cutting off the current that passes through the first and second fuses in accordance with the necessity or non-necessity of the use of the redundant circuits. With this structure, even if the first and second fuses remain intact (for example, when the redundant circuit is not used), no current may flow through these intact fuses.

The current cut off circuit may include first and second field effect transistors having current paths that are connected in series with the first and second fuses. A pad electrode may be connected to a gate of the first field effect transistor. A load resistor may be connected between a power supply and the gate of the first field effect transistor. A fuse circuit may be included for determining a conductive state of the second field effect transistor in accordance with the necessity of the use of the redundant circuits. In this way, it may be possible to cut off a current that passes through the first and second fuses.

The current cut off circuit may include a field effect transistor connected in series with the first and second fuses. A flip-flop circuit may be included that can be stabilized by applying a potential that can turn on the field effect transistor upon detecting a power up operation. A discriminating circuit may be included that can detect a test mode for characterizing a memory cell array to determine if defects exist while forcing the flip-flop into a desired state. In this way, it may be possible to cut off the current that passes through the first and second fuses without providing a dedicated pad electrode.

The discriminating circuit may include a fuse for preventing the flip-flop from being forced into the desired state. By doing so, a current that passes through the first and second fuses may be prevented from being erroneously cut off after the characterization has been completed.

The current cut off circuit may include a field effect transistor connected in series to the first and second fuses. A flip-flop circuit may be connected to the gate of the field effect transistor. A reset circuit may be provided for resetting the state of the flip-flop circuit by detecting the occurrence of a power-up operation. In this way, it may be possible to cut off the current that passes through the first and second fuses without supplying an external signal.

It is understood that a characterization of a device can include a test to determine if defective bits exist on a semiconductor memory device. The characterization may also include examination of other qualities, such as various operating currents, on-chip voltage regulators, or any other circuit or device characterization where it may be desirable to reduce affects caused due to current consumption, as just a few examples.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
    a defect address memory circuit programmable to store a defect address corresponding to an address location of at least one normal memory cell in a memory cell array that is replaced with at least one redundant memory cell;
    the defect address memory circuit including
        first and second fuses electrically connected in series and coupled between a first supply potential and a second supply potential wherein one of the first and second fuses is cut in accordance with a logical value of a bit of the defect address when the at least one normal memory cell is replaced with at least one redundant memory cell; and
        a current cut off circuit essentially cutting off a current that passes through the first and second fuses during a characterization of the semiconductor memory device.

2. The semiconductor memory device according to claim 1, wherein:
    the current cut off circuit essentially cuts off the current that passes through the first and second fuses when the defect memory circuit does not store the defect address.

3. The semiconductor memory device according to claim 2, wherein the current cut off circuit includes:
    first and second field effect transistors having current paths coupled in series with the first and second fuses;
    a pad electrode coupled to a control gate of the first field effect transistor;
    a load device coupled between the first supply potential and the pad electrode; and
    a fuse circuit coupled to a control gate of the second field effect transistor to determine a conductive state of the second field effect transistor in accordance with whether the defect memory circuit stores the defect address.

4. The semiconductor memory device according to claim 2, wherein the current cut off circuit includes:
    a field effect transistor having a current path coupled in series with the first and second fuses;
    a flip-flop circuit coupled to a control gate of the field effect transistor.

5. The semiconductor memory device according to claim 4, wherein the current cut off circuit further includes:
    a mode entry circuit that detects a current cutoff mode to set the flip-flop in a state where the field effect transistor is turned off.

6. The semiconductor memory device according to claim 4, wherein the current cut off circuit includes a programmable device to prevent the test mode entry circuit from setting the state of the flip-flop.

7. The semiconductor memory device according to claim 4, wherein, upon power-up, the flip-flop is set in a state where the field effect transistor is turned on.

8. The semiconductor memory device according to claim 4, wherein the current cut off circuit further includes:
    a reset circuit that detects a power up operation and provides a reset signal to set the state of the flip-flop.

9. A semiconductor memory device, comprising:
    a defect address storing circuit programmable to store a defect address corresponding to an address location of at least one normal memory cell in a memory cell array that is replaced with at least one redundant memory cell;
    the defect address storing circuit including
        a plurality of programmable element pairs, each programmable element pair including first and second programmable elements electrically connected in series and coupled between a first supply potential and an internal supply potential node wherein one of the first and second programmable elements is programmed to be in a non-conductive state in accordance with a logical value of a corresponding bit of the defect address when the at least one normal memory cell is replaced with at least one redundant memory cell; and
        a current cut off circuit coupled to the internal supply potential node and essentially cutting off a current that passes through the plurality of programmable element pairs during a characterization of the semiconductor memory device.

10. The semiconductor memory device according to claim 9, wherein the current cut off circuit includes:
    a first field effect transistor coupled between the internal supply potential node and a second supply potential.

11. The semiconductor memory device according to claim 10, wherein the current cut off circuit includes:
    a probe pad coupled to a control gate of the first field effect transistor.

12. The semiconductor memory device according to claim 10, wherein the current cut off circuit includes:
    a mode circuit for detecting a characterization entry mode and coupled to provide a control signal to a control gate of the first field effect transistor.

13. The semiconductor memory device according to claim 9, wherein the characterization of the semiconductor memory device is performed before the defect address is stored.

14. The semiconductor memory device according to claim 9, further including:

a plurality of defect address storing circuits coupled to the current cut off circuit.

15. The semiconductor memory device according to claim 14, wherein:

in a normal mode of operation, the current cut off circuit cuts off the current that passes through the plurality of programmable element pairs for each of the plurality of defect address storing circuits that does not store a corresponding defect address; and in the normal mode of operation, the current cut off circuit does not cut off the current that passes through the plurality of programmable element pairs for each of the plurality of defect address storing circuits that does store a corresponding defect address.

16. A semiconductor memory device, comprising:

a defect address storing circuit programmable to store a defect address corresponding to an address location of at least one normal memory cell in a memory cell array that is replaced with at least one redundant memory cell;

the defect address storing circuit including a plurality of programmable element pairs, each programmable element pair including first and second programmable elements electrically connected in series and coupled between a first supply potential and an internal supply potential node wherein one of the first and second programmable elements is programmed to be in a non-conductive state in accordance with a logical value of a corresponding bit of the defect address when the at least one normal memory cell is replaced with at least one redundant memory cell; and a current cut off circuit including a cut off circuit current path coupled between the internal supply potential node and a second supply potential and essentially disabling the cut off circuit current path during a characterization of the semiconductor memory device.

17. The semiconductor memory device according to claim 16, wherein:

the cut off circuit includes a third programmable element that is programmed according to whether the at least one normal memory cell is replaced with at least one redundant memory cell; and the cut off circuit current path is disabled when the third programmable element indicates that the at least one normal memory cell is not replaced with at least one redundant memory cell.

18. The semiconductor memory device according to claim 17, wherein:

the third programmable element forms a third programmable current path coupled between the first supply potential and the second supply potential; and the cut off circuit essentially disables the third programmable current path during the characterization of the semiconductor memory device.

19. The semiconductor memory device according to claim 16, wherein:

the cut off circuit includes a probe pad that receives an externally applied potential during the characterization of the semiconductor memory device.

20. The semiconductor memory device according to claim 16, wherein:

the characterization of the semiconductor memory device occurs before a packaging step and before the programmable elements are selectively programmed.

* * * * *